US009779797B2

(12) United States Patent
Ino et al.

(10) Patent No.: US 9,779,797 B2
(45) Date of Patent: Oct. 3, 2017

(54) NON-VOLATILE MEMORY DEVICE

(71) Applicant: Toshiba Memory Corporation, Tokyo (JP)

(72) Inventors: Tsunehiro Ino, Fujisawa (JP); Shosuke Fujii, Kuwana (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/245,752

(22) Filed: Aug. 24, 2016

(65) Prior Publication Data
US 2016/0365133 A1 Dec. 15, 2016

Related U.S. Application Data

(63) Continuation of application No. PCT/JP2015/057695, filed on Mar. 16, 2015.

(30) Foreign Application Priority Data

Mar. 17, 2014 (JP) .................................. 2014-053992

(51) Int. Cl.
*G11C 11/22* (2006.01)
*H01L 27/10* (2006.01)
(Continued)

(52) U.S. Cl.
CPC ........ *G11C 11/2273* (2013.01); *G11C 11/221* (2013.01); *G11C 11/223* (2013.01);
(Continued)

(58) Field of Classification Search
CPC . G11C 11/2273; G11C 11/221; G11C 11/223; G11C 11/2275; H01L 27/101; H01L 29/045
See application file for complete search history.

(56) References Cited

U.S. PATENT DOCUMENTS 5,329,485 A    7/1994  Isono et al.
6,388,285 B1   5/2002  Black et al.
(Continued)

FOREIGN PATENT DOCUMENTS

JP    4-180261      6/1992
JP    2000-31397    1/2000
(Continued)

OTHER PUBLICATIONS

International Search Report dated May 19, 2015 in PCT/JP2015/057695, filed on Mar. 16, 2015.
(Continued)

*Primary Examiner* — Tri Hoang
(74) *Attorney, Agent, or Firm* — Oblon, McClelland, Maier & Neustadt, L.L.P.

(57) ABSTRACT

A non-volatile memory device according to an embodiment includes a first conductive layer, a second conductive layer including metal nitride, the metal nitride absorbing oxygen, a paraelectric layer disposed between the first conductive layer and the second conductive layer, a ferroelectric layer disposed between the paraelectric layer and the second conductive layer, the ferroelectric layer including hafnium oxide, at least one third conductive layer disposed on opposite side of at least one of the first conductive layer and the second conductive layer to the ferroelectric layer, the at least one third conductive layer including metal oxide, the metal oxide having oxygen ratio larger than stoichiometric ratio, and a sense circuit configured to read data based on tunneling current flow between the first conductive layer and the second conductive layer through the paraelectric layer and the ferroelectric layer.

10 Claims, 10 Drawing Sheets

(51) Int. Cl.
*H01L 29/04* (2006.01)
*H01L 27/06* (2006.01)

(52) U.S. Cl.
CPC ........ *G11C 11/2275* (2013.01); *H01L 27/101* (2013.01); *H01L 29/045* (2013.01); *H01L 27/0688* (2013.01)

(56) References Cited

U.S. PATENT DOCUMENTS

| | | | |
|---|---|---|---|
| 7,525,832 | B2 | 4/2009 | Muraoka et al. |
| 2007/0045689 | A1* | 3/2007 | Lim .................. H01L 27/11502 257/295 |
| 2008/0212359 | A1 | 9/2008 | Muraoka et al. |
| 2009/0001436 | A1 | 1/2009 | Kondo |
| 2009/0061538 | A1* | 3/2009 | Heo ........................ H01G 4/085 438/3 |
| 2009/0067215 | A1 | 3/2009 | Muraoka et al. |
| 2009/0127603 | A1 | 5/2009 | Yamakawa et al. |
| 2010/0015729 | A1* | 1/2010 | Choi .................. H01L 21/3105 438/3 |
| 2011/0227031 | A1 | 9/2011 | Li et al. |
| 2013/0043451 | A1 | 2/2013 | Lee et al. |
| 2013/0149794 | A1* | 6/2013 | Wang ............... H01L 27/11507 438/3 |
| 2013/0308392 | A1 | 11/2013 | Nishijima et al. |
| 2014/0070289 | A1 | 3/2014 | Tanaka et al. |
| 2016/0005961 | A1 | 1/2016 | Ino |

FOREIGN PATENT DOCUMENTS

| | | |
|---|---|---|
| JP | 2000-357777 | 12/2000 |
| JP | 2002-198495 | 7/2002 |
| JP | 3504058 | 3/2004 |
| JP | 2005-191358 | 7/2005 |
| JP | 2006-324625 | 11/2006 |
| JP | 2007-43166 | 2/2007 |
| JP | 2009-16368 | 1/2009 |
| JP | 2009-117768 | 5/2009 |
| JP | 2009-239129 | 10/2009 |
| JP | 2010-16127 | 1/2010 |
| JP | 2011-243631 | 12/2011 |
| JP | 2013-46066 | 3/2013 |
| JP | 2013-257934 | 12/2013 |
| JP | 2015-15334 | 1/2015 |
| WO | WO 2010/080079 A1 | 7/2010 |

OTHER PUBLICATIONS

Japanese Office Action dated Dec. 1, 2015 in Japanese Patent Application No. 2015-528790 ( with English Translation).
Japanese Office Action dated May 17, 2016 in Japanese Patent Application No. 2015-528790 ( with English Translation).
J. Muller et al."Ferroelectric $Zr_{0.5}Hf_{0.5}O_2$ thin films for nonvolatile memory applications", Applied Physics Letters 99, 2011, 4 pages.
T.S. Boscke et al. "Ferroelectricity in hafnium oxide thin films", Applied Physics Letters 99, 2011, 4 pages.

* cited by examiner

NON-VOLATILE MEMORY DEVICE

CROSS-REFERENCE TO RELATED APPLICATION

This application is continuation application of, and claims the benefit of priority from the International Application PCT/JP2015/057695, filed Mar. 16, 2015, which claims the benefit of priority from Japanese Patent Application No. 2014-053992, filed on Mar. 17, 2014, the entire contents of all of which are incorporated herein by reference.

FIELD

Embodiments described herein relate generally to a non-volatile memory device.

BACKGROUND

In a semiconductor non-volatile memory device, a device using a ferroelectric substance has been studied for many years as a ferroelectric random access memory (FeRAM). Among such FeRAMs, a memory device having a configuration of replacing a volatile capacitor of a dynamic random access memory (DRAM) with a non-volatile ferroelectric capacitor is put into practical use taking advantage of power-saving feature.

Further, study has also been made for many years on a memory device of metal ferroelectric silicon (MFS) type or a memory device of metal ferroelectric insulator silicon (MFIS) type in which ferroelectric substance is applied for a gate insulating film.

On the other hand, a ferroelectric tunnel junction (FTJ) device in which polarization of the ferroelectric substance is detected by reading tunnel current flowing in the ferroelectric substance has also been studied. However, there is a problem in that it is highly difficult to integrate materials used in the related arts, such as $BaTiO_3$ and $PbZr_{0.5}Ti_{0.5}O_3$, with a large scale integration (LSI) technology using a complementary metal oxide silicon (CMOS).

DETAILED DESCRIPTION

Figure 1:
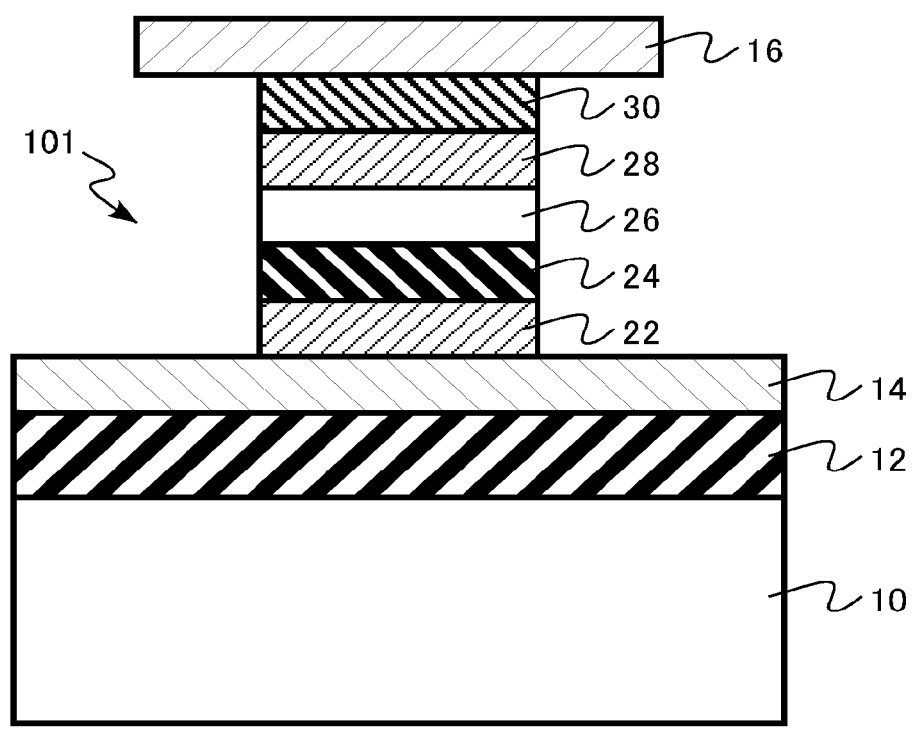
FIG. 1 is a schematic cross-sectional view illustrating a memory cell portion of a non-volatile memory device according to a first embodiment.

A non-volatile memory device according to an embodiment includes: a first conductive layer; a second conductive layer including metal nitride, the metal nitride absorbing oxygen; a paraelectric layer disposed between the first conductive layer and the second conductive layer; a ferroelectric layer disposed between the paraelectric layer and the second conductive layer, the ferroelectric layer including hafnium oxide; at least one third conductive layer disposed on opposite side of at least one of the first conductive layer and the second conductive layer to the ferroelectric layer, the at least one third conductive layer including metal oxide, the metal oxide having oxygen ratio larger than stoichiometric ratio; and a sense circuit configured to read data based on tunneling current flow between the first conductive layer and the second conductive layer through the paraelectric layer and the ferroelectric layer.

In the present specification, note that an identical or similar member will be denoted by a same reference sign and repetition of the same description may be omitted.

In the present specification, note that a "ferroelectric substance" represents the substance that has spontaneous polarization even without applying an electric field from the outside, and has the polarization reversed when an electric field is applied from the outside. Further, in the present specification, note that a "paraelectric substance" represents the substance that generates polarization when an electric field is applied, and eliminates the polarization when the electric field is removed.

In the present specification, note that a "low oxygen concentration conductive layer" represents a conductive layer in which a value obtained by multiplying the number of oxygen ions inside the layer by a valence 2 of oxygen is smaller than a value obtained by multiplying the number of positive ions by a valence of the positive ion. In other words, the low oxygen concentration conductive layer represents the conductive layer in which a quantitative ratio between the value obtained by multiplying the number of oxygen ions inside the layer by the valence 2 of oxygen and the value obtained by multiplying the number of positive ions by the valence of the positive ion ((number of oxygen ions×valence of oxygen, namely, 2)/(number of positive ions/valence of positive ion)) is smaller than 1.

Further, in the present specification, note that a "high oxygen concentration conductive layer" represents a conductive layer in which a value obtained by multiplying the number of oxygen ions inside the layer by a valence 2 of oxygen is larger than a value obtained by multiplying the number of positive ions by a valence of the positive ion. In other words, the high oxygen concentration conductive layer represents the conductive layer in which a quantitative ratio between the value obtained by multiplying the number of oxygen ions inside the layer by the valence 2 of oxygen and the value obtained by multiplying the number of positive ions by the valence of the positive ion ((number of oxygen ions×valence of oxygen, namely, 2)/(number of positive ions/valence of positive ion)) is larger than 1.

Here, a fact that the value obtained by multiplying the number of oxygen ions inside the layer by the valence 2 of oxygen is smaller than the value obtained by multiplying the number of positive ions by the valence of the positive ion indicates a characteristic of a film in which composition is controlled such that the number of divalent oxygen ions becomes less than two for each Hf ion that is a tetravalent positive ion, different from, for example, a film representing $(HfO_2)_x(SiO_2)_{1-x}$ that is a stoichiometric ratio generated by a normal film forming method using HfSiO that may be universally observed as a general abbreviated notation and may also be used in an embodiment.

Embodiments of the present disclosure will be described below with reference to the drawings.

(First Embodiment) A non-volatile memory device according to the present embodiment includes: a first conductive layer; a second conductive layer including metal nitride, the metal nitride absorbing oxygen; a paraelectric layer disposed between the first conductive layer and the second conductive layer; a ferroelectric layer disposed between the paraelectric layer and the second conductive layer, the ferroelectric layer including hafnium oxide; at least one third conductive layer disposed on opposite side of at least one of the first conductive layer and the second conductive layer to the ferroelectric layer, the at least one third conductive layer including metal oxide, the metal oxide having oxygen ratio larger than stoichiometric ratio; and a sense circuit configured to read data based on tunneling current flow between the first conductive layer and the second conductive layer through the paraelectric layer and the ferroelectric layer. A non-volatile memory device according to the present embodiment includes: a first conductive layer in which a value obtained by multiplying the number of oxygen ions inside the layer by a valence 2 of oxygen is smaller than a value obtained by multiplying the number of positive ions by a valence of the positive ion; an insulating film provided in a manner contacting the first conductive layer; a ferroelectric film of hafnium oxide provided on an opposite side of the first conductive layer of the insulating film in a manner contacting the insulating film; a second conductive layer provided on an opposite side of the insulating film of the ferroelectric film in a manner contacting the ferroelectric film, in which a value obtained by multiplying the number of oxygen ions inside the layer by a valence 2 of oxygen is smaller than a value obtained by multiplying the number of positive ions by a valence of the positive ion; and a third conductive layer of metal oxide provided on an opposite side of the ferroelectric film of one or both of the first conductive layer and the second conductive layers in a manner contacting the first conductive layer or the second conductive layer, in which a value obtained by multiplying the number of oxygen ions inside the layer by a valence 2 of oxygen is larger than a value obtained by multiplying the number of positive ions by a valence of the positive ion.

In the non-volatile memory device according to the present embodiment, polarization degradation at the ferroelectric film is reduced by having the above-described structure. Therefore, the number of times when data can be rewritten is increased. In other words, endurance characteristics are improved.

Figure 2:
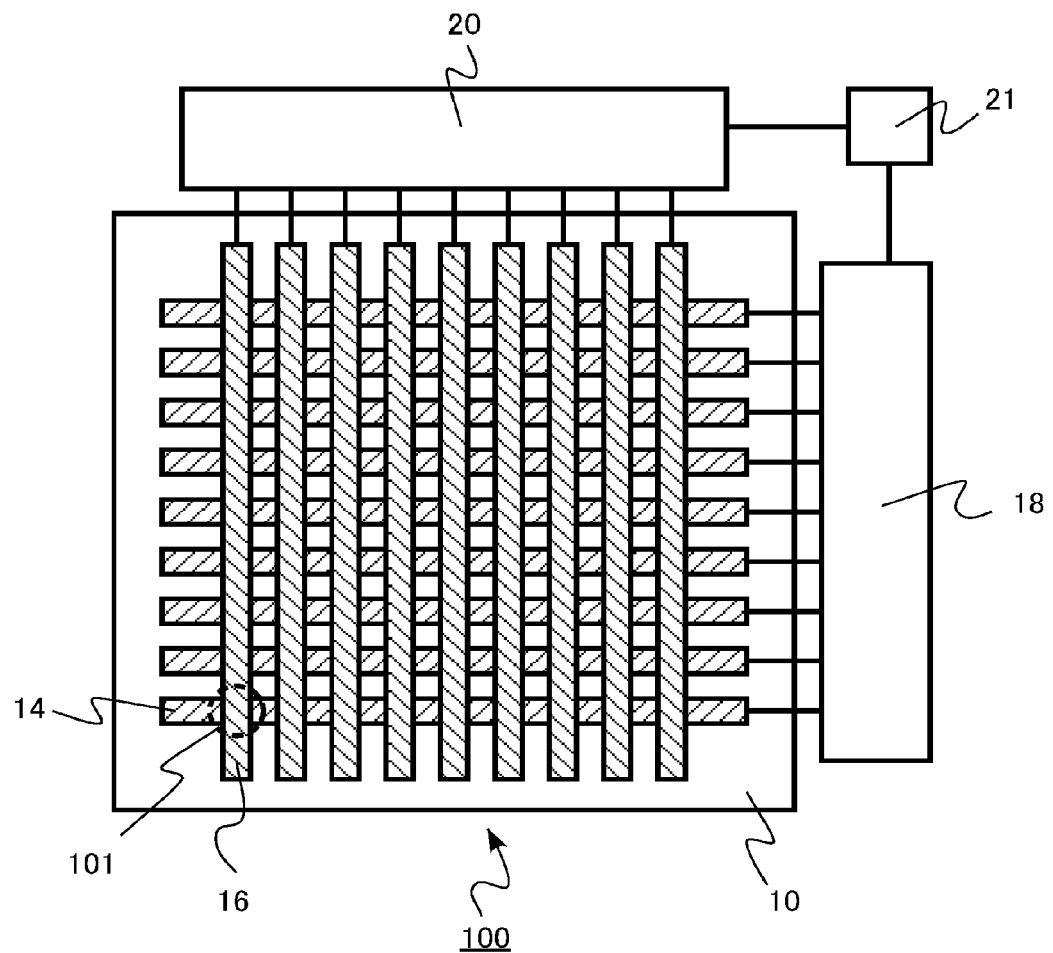
FIG. 2 is a conceptual diagram illustrating a memory cell array and a peripheral circuit of the non-volatile memory device according to the first embodiment.

FIG. 1 is a schematic cross-sectional view illustrating a memory cell portion of the non-volatile memory device according to the present embodiment. FIG. 2 is a conceptual diagram illustrating a memory cell array 100 and a peripheral circuit of the non-volatile memory device according to the present embodiment. FIG. 1 illustrates a cross-section of one memory cell 101 indicated by a circle of a dotted line inside the memory cell array 100 in FIG. 2, for example.

The memory cell array of the non-volatile memory device according to the present embodiment includes, on a semiconductor substrate 10, multiple first electrode wiring 14 and multiple second electrode wiring 16 intersecting with the first electrode wiring 14. An insulating film 12 may be disposed between the substrate 10 and the first electrode wiring 14. The second electrode wiring 16 is provided in an upper layer of the first electrode wiring 14. Further, around the memory cell array 100, a first control circuit 18, a second control circuit 20, and a sense circuit 21 are provided as peripheral circuits.

In an area where the first electrode wiring 14 intersects with the second electrode wiring 16, a plurality of memory cells 101 is provided. The non-volatile memory device according to the present embodiment includes a so-called cross-point structure.

The memory cell 101 is a two-terminal FTJ device interposed between the first electrode wiring 14 and the second electrode wiring 16 as illustrated in FIG. 1. The FTJ device functions as the memory cell, utilizing change of a current amount of tunnel current caused by polarization reversal of a ferroelectric substance.

Each of the first electrode wiring 14 is connected to the first control circuit 18. Further, each of the second electrode wiring 16 is connected to the second control circuit 20. The sense circuit 21 is connected to the first control circuit 18 and the second control circuit 20.

The first control circuit 18 and the second control circuit 20 have functions to, for example, select a desired memory cell, write data in the memory cell, read data of the memory cell, erase data of the memory cell, and so on. At the time of data reading, the data of the memory cell is read as an amount of current flowing between the first electrode wiring 14 and the second electrode wiring 16. The sense circuit 21 has a function to determine this current amount and detect polarity of the data. For example, whether the data is "0" or "1" is determined.

Each of the first control circuit 18, second control circuit 20, and sense circuit 21 is formed of, for example, an electronic circuit using a semiconductor device formed on the semiconductor substrate 10.

The semiconductor substrate 10 is, for example, a (100) plane single-crystal silicon (Si) substrate. Besides that, a single-crystal germanium substrate, a SiGe epitaxial substrate, an InP substrate, a GaN substrate, a GaAs substrate, an IGZO substrate, or the like can be also used. Preferably, the semiconductor substrate is a substrate suitable for forming the peripheral circuit using the semiconductor device.

The insulating film 12 is, for example, a silicon oxide film such as $SiO_2$ film. Not limited to the silicon oxide film, any film that can keep an electrical insulation property between the semiconductor substrate 10 and the wiring can be used, such as an $Al_2O_3$ film, a SiON film, a SiN film, a single-crystal or amorphous $HfO_2$ film, a single-crystal or amorphous $ZrO_2$ film, a single-crystal or amorphous $Hf_{1-x}M_xO_{2-y}$ film (M includes one or more of Si, Y, Zr, Al, Sr, Ba, Ca, Gd, La, Ce, Pr, Nd, Sm, Eu, Tb, Dy, Ho, Er, Tm, Yb, Lu, and Sc), a HfSiO film, a HfSiON film, a ZrSiO film, a ZrSiON film, a SiOC film, or a mixture of these films.

For example, the first electrode wiring 14 is a word line, and the second electrode wiring 16 is a bit line. The first electrode wiring 14 and the second electrode wiring 16 are metal wiring, for example. Exemplary materials of the metal wiring are Cu, Al, Ta, Mo, TiN, TaN, and MoN.

Further, materials of the first electrode wiring 14 and the second electrode wiring 16 can also be carbon nanotube and graphene. Any material having conductivity may be used as the materials of the first electrode wiring 14 and the second electrode wiring 16.

As illustrated in FIG. 1, the memory cell 101 has a structure in which a first low oxygen concentration conductive layer (first conductive layer) 22, an insulating film 24, a ferroelectric film 26 of hafnium oxide, a second low oxygen concentration conductive layer (second conductive layer) 28, and a high oxygen concentration conductive layer (third conductive layer) 30 are stacked in a direction from the first electrode wiring 14 side to the second electrode wiring 16.

The first low oxygen concentration conductive layer (first conductive layer) 22 is provided on the first electrode wiring 14. In the first low oxygen concentration conductive layer (first conductive layer) 22, a value obtained by multiplying the number of oxygen ions inside the layer by a valence 2 of oxygen is smaller than a value obtained by multiplying the number of positive ions by a valence of the positive ion. Preferably, a material of the first low oxygen concentration conductive layer 22 has low oxygen concentration and high heat resistance.

An exemplary material of the first low oxygen concentration conductive layer 22 is metal nitride. The first low oxygen concentration conductive layer 22 may include metal nitride that absorbs oxygen. The metal nitride is, for example, titanium nitride (TiN). Further, another exemplary material of the first low oxygen concentration conductive layer 22 is resistance-reduced polycrystalline silicon obtained by doping n-type or p-type impurities at high concentration, or amorphous silicon. The concentration of the n-type or p-type impurities is, preferably, $1\times10^{20}$ atoms/$cm^3$ or more. Further, oxygen atoms that can be negative ions having the number less than the number of silicon atoms that can be positive ions may be included, too.

As the materials of the first low oxygen concentration conductive layer 22, for example, Ru, Ir, Os, Pt, Rh, Pd, Ta, Nb, W, Mo, Hf, Zr, Re, Ti, Ni, Co, Fe, Mn, Cr, V, Ti, graphene, amorphous carbon, CuN, CuAlN, SrN, BaN, STAlN, BaAlN, TiN, ZrN, HfN, TiAlN, ZrAlN, HfAlN, VN, NbN, TaN, VAlN, NbAlN, TaAlN, CrN, MoN, WM, CrAlN, MoAlN, WAlN, MnN, MnAlN, ReN, ReAlN, FeN, FeN, CoN, CoN, NiN, CuSi, MgSi, CaSi, SrSi, BaSi, LnSi (Ln is one or more of La, Ce, Pr, Nd, Sm, Eu, Gd, Tb, Dy, Ho, Er, Tm, Yb, L), TiSi, ZrSi, HfSi, VSi, NbSi, TaSi, CrSi, MoSi, WSi, MnSi, FeSi, CoSi, NiSi, CaC, SrC, BaC, BC, AlC, SiC, TiC, ZrC, HfC, VC, NbC, TaC, CrC, MoC, WC, MnC, ReC, MgB, CaB, SrB, BaB, AlB, LnB (Ln is one or more of La, Ce, Pr, Nd, Sm, Eu, Gd, Tb, Dy, Ho, Er, Tm, Yb, and L), TiB, ZrB, HfB, NbB, TaB, MoB, WB, MnB, FeB, CoB, NiB, MgNi, CaNi, LnNi (Ln is one or more of La, Ce, Pr, Nd, Sm, Eu, Gd, Tb, Dy, Ho, Er, Tm, Yb, and L) NiTi, NiZr, NiHf can be also used besides TiN, polycrystalline silicon, and amorphous silicon. Further, metal atoms that can be positive ions, or oxygen atoms that can be negative ions having the number less than the number of carbon atoms may also be included.

The insulating film 24 is provided in a manner contacting the first low oxygen concentration conductive layer (first conductive layer) 22. The insulating film 24 functions as a tunnel insulating film that allows carriers to flow as tunnel current at the time of writing, reading, and erasing data of the memory cell. Further, since the insulating film 24 is interposed, the FTJ device has a diode function, more specifically, a rectification property. From the viewpoint of stable operation of the memory cell 101, preferably, the insulating film 24 is a paraelectric film. However, in principle, the insulating film 24 is operable even in the case of using a ferroelectric film, an antiferroelectric film, a ferri-dielectric film, or the like formed of a material having conduction electron offset or valence electron offset different from the ferroelectric film 26.

Further, preferably, an effective oxide thickness (EOT) of the insulating film 24 is thinner than an EOT of the ferroelectric film 26. The reason is that: when the EOT of the insulating film 24 is thicker than the EOT of the ferroelectric film 26, a sufficient electric field is hardly applied to the ferroelectric film 26, and polarization reversal is hardly caused at the ferroelectric film 26.

While writing is performed in the memory cell 101, the tunnel current flows in the insulating film 24. Therefore, when the writing electric field is excessively applied, the FTJ device may be broken. From this viewpoint, the EOT of the insulating film 24 is preferably thin. At the same time, preferably, the insulating film 24 is the material having high dielectric breakdown voltage.

The insulating film 24 has a film thickness of, for example, 0.5 nm or more and 3 nm or less. The insulating film 24 is, for example, a silicon oxide film such as $SiO_2$ film.

Besides the silicon oxide film, for example, films of amorphous or $P2_1/c$ of space group number 14, $P4_2/nmc$ of space group number 137, Fm3m of space group number 225, Pbca of space group number 61, Pnma of space group number 62, or $Hf_{1-x-y}Zr_xM_yO_{(2-z)(1-w)}N_w$ of $P2_12_12_1$ of space group number 19 (however, 0≤x≤1, 0≤y≤0.5, −0.1≤z≤0.2, 0≤w≤0.7, and M is one or more of Si, Ge, B, Al, Ga, In, P, As, Bi, Mg, Ca, Sr, Ba, Zn, Cd, Ti, Ta, Mo, W, Sc, Y, La, Ce, Pr, Nd, Sm, Eu, Gd, Tb, Dy, Ho, Er, Tm, Yb, and Lu) can be applied as the insulating film 24. Further, films of $LnAlO_3$ (Ln is one or more of La, Ce, Pr, Nd, Sm, Eu, Gd, Tb, Dy, Ho, Er, Tm, Yb, and L), LnSiO (Ln is one or more of La, Ce, Pr, Nd, Sm, Eu, Gd, Tb, Dy, Ho, Er, Tm, Yb, and L), HfSiO, HfSiON, HfAlO, $Al_2O_3$, MgO, $Ln_2O_3$ (Ln is one or more of La, Pr, Nd, Sm, Eu, Gd, Tb, Dy, Ho, Er, Tm, Yb, and L), $CaF_2$, $SrF_2$, $BaF_2$, $LnF_3$ (Ln is one or more of La, Ce, Pr, Nd, Sm, Eu, Gd, Tb, Dy, Ho, Er, Tm, Yb, and L), etc. can be also applied.

The ferroelectric film 26 is provided on an opposite side of the first low oxygen concentration conductive layer (first conductive layer) 22 of the insulating film 24 in a manner contacting the insulating film 24. The ferroelectric film 26 is hafnium oxide. Hafnium oxide exerts ferroelectricity by having a crystal structure of space group $Pbc2_1$ (space group number 29).

The ferroelectric film 26 has a film thickness of, for example, 1.0 nm or more and 10 nm or less. Preferably, a sum of the film thickness of the ferroelectric film 26 and the film thickness of the insulating film 24 is 10 nm or less from the viewpoint of preventing high voltage at the time of data writing.

An exemplary composition of the ferroelectric film 26 is $Hf_{1-x}M_xO_{2-y}$. Here, M is one or more of Si, Y, Zr, Al, Sr, Ba, Ca, Gd, La, Ce, Pr, Nd, Sm, Eu, Tb, Dy, Ho, Er, Tm, Yb, Lu, and Sc. In the case of M≠Zr, Zr may be included 2% or less of Hf that separately enters an Hf site as impurities under the condition that x satisfies: $0 \leq x \leq 0.25$. Further, in the case of M=Zr, x and y satisfy the following conditions: $0.45 \leq x \leq 0.55$ and $0 \leq y \leq 0.1$.

The second low oxygen concentration conductive layer (second conductive layer) 28 is provided on an opposite side of the insulating film 24 of the ferroelectric film 26 in a manner contacting the ferroelectric film 26.

An exemplary material of the second low oxygen concentration conductive layer 28 is metal nitride. The second low oxygen concentration conductive layer 28 may include metal nitride that absorbs oxygen. The metal nitride is, for example, titanium nitride (TiN). Further, another exemplary material of the second low oxygen concentration conductive layer 28 is resistance-reduced polycrystalline silicon obtained by doping impurities at high concentration, or amorphous silicon. Furthermore, titanium atoms that can be negative ions or oxygen atoms that can be positive ions having the number less than the number of silicon atoms may also be included in the second low oxygen concentration conductive layer 28.

As the materials of the second low oxygen concentration conductive layer 28, for example, Ru, Ir, Os, Pt, Rh, Pd, Ta, Nb, W, Mo, Hf, Zr, Re, Ti, Ni, Co, Fe, Mn, Cr, V, Ti, graphene, amorphous carbon, CuN, CuAlN, SrN, BaN, SrAlN, BaAlN, TiN, ZrN, HfN, TiAlN, ZrAlN, HfAlN, VN, NbN, TaN, VAlN, NbAlN, TaAlN, CrN, MoN, WN, CrAlN, MoAlN, WAlN, MnN, MnAlN, ReN, ReAlN, FeN, FeN, CoN, CoN, NiN, CuSi, MgSi, CaSi, SrSi, BaSi, LnSi (Ln is one or more of La, Ce, Pr, Nd, Sm, Eu, Gd, Tb, Dy, Ho, Er, Tm, Yb, and L), TiSi, ZrSi, HfSi, VSi, NbSi, TaSi, CrSi, MoSi, WSi, MnSi, FeSi, CoSi, NiSi, CaC, SrC, BaC, BC, AlC, SiC, TiC, ZrC, HfC, VC, NbC, TaC, CrC, MoC, WC, MnC, ReC, MgB, CaB, SrB, BaB, AlB, LnB (Ln is one or more of La, Ce, Pr, Nd, Sm, Eu, Gd, Tb, Dy, Ho, Er, Tm, Yb, and L), TiB, ZrB, HfB, NbB, TaB, MoB, WB, MnB, FeB, CoB, NiB, MgNi, CaNi, LnNi (Ln is one or more of La, Ce, Pr, Nd, Sm, Eu, Gd, Tb, Dy, Ho, Er, Tm, Yb, and L), NiTi, NiZr, and NiHf can be also used besides TiN, polycrystalline silicon, and amorphous silicon. Further, metal atoms that can be positive ions, or oxygen atoms that can be negative ions having the number less than the number of carbon atoms may also be included.

Meanwhile, the first low oxygen concentration conductive layer 22 and second low oxygen concentration conductive layer 28 may be formed of either the same material or different materials.

The high oxygen concentration conductive layer (third conductive layer) 30 is provided on an opposite side of the ferroelectric film 26 of the second low oxygen concentration conductive layer (second conductive layer) 28 in a manner contacting the second low oxygen concentration conductive layer 28. The high oxygen concentration conductive layer (third conductive layer) 30 is metal oxide in which a value obtained by multiplying the number of oxygen ions inside the layer by a valence 2 of oxygen is larger than a value obtained by multiplying the number of positive ions by a valence of the positive ion. The high oxygen concentration conductive layer 30 includes metal oxide having oxgen ratio larger than stoichiometric ratio. The high oxygen concentration conductive layer 30 includes metal oxide that supplies oxygen.

Preferably, the high oxygen concentration conductive layer 30 has a film thickness of 1 nm or more and 10 nm, for example. In the case of exceeding 10 nm, the FTJ device is upsized, thereby causing a problem of increasing manufacturing cost.

A material of the high oxygen concentration conductive layer 30 is conductive metal oxide. Preferably, the material of the high oxygen concentration conductive layer 30 has high content of oxygen. Further, from the viewpoint of manufacturing, the material preferably has a property hardly deteriorated even when heat treatment is applied at 600° C. or more and 800° C. or less. An exemplary material of the first high oxygen concentration conductive layer 30 is ruthenium oxide (RuO). An example thereof is $RuO_2$.

The material of the high oxygen concentration conductive layer 30 is not limited to RuO, and any conductive metal oxide having the high content of oxygen can be applied, such as IrO, Rho, PtO, SrRuO, ReO, LaCuO, NbO, MoO, LaTiO, LaVO, SrFeO, CaVO, SrMoO, SrIrO, BaMoO, BaIrO, BaRuO, CaMoO, CaNbO, SrNbO, BaNbO, KMoO, LaMnO, LaNiO, SrCrO, PbMO, LiTiO, YCoO, ErCoO, LaCoO, LnNiO (Ln is a lanthanoid element), LnBaCuO (Ln is a lanthanoid element), LnSrCuO (Ln is a lanthanoid element), BiSeCuO, ABO (A is Y, Ln (Ln is a lanthanoid element), Tl, In, Pb, Bi, B, Cd, B is Ti, V, Cr, Mn, Nb, Mo, Zr, Tc, Hf, Re, Ru, Rh, Pd, Os, Ir, Pt, Si, Ge, Sn, Ga, Sb, etc.), LaBaCuO (an additive amount of Ba and an oxygen amount are values in an area of a superconductivity-developed composition or an excessively-doped composition), LaSrCuO (an additive amount of Sr and an oxygen amount are values in the area of the superconductivity-developed composition or the excessively-doped composition), YBaCuO, YmBaCuO (Ym is Yt, Lu, Tm, Ho, or the like), BiSrCaCuO, TlMCaCuO (M is Ba or Sr), TlMCaCuO (M is Ba or Sr), HgBaCaCuO, NdCeCuO, SrNdCuO, SrBaCuO (Sr, Ba and O are values in the area of the superconductivity-developed composition or the excessively-doped composition), LaSrCaCuO, and LaCaCuO. Further, BaKBiO that is an oxide superconductor (K and O are values in the area of the superconductivity-developed composition or the excessively-doped composition), SrRuO, BaPbBiO, BiGdRuO, LaSrMnO, ZnLiVO, SnO, TiO, CuO, AgO, InO, TlO, ZnO, BaTi (Nb) O, SrTi (Nb) O, LaCrO, WO, TlOF, NiO, CoO, CuO, CrO, MnO, VCrO, FeO, VO, TiO, TiO, EuO (Gd), etc. can be applied, too.

From the viewpoint of consistency with a CMOS process, $RuO_2$, $IrO_2$, $PtO_2$, $OsO_2$, $RhO_2$, $ReO_3$, $NbO$, $MoO_2$, $WO_3$, $EuO_x(Gd)$ (x is a value of 1.5 or more and 2 or less) or a mixture of these materials are more preferable. Especially, $RuO_2$ is a preferable material because of little influence on other materials in the CMOS process, and low manufacturing cost.

The second electrode wiring 16 is provided on the high oxygen concentration conductive layer 30.

In the following, an exemplary manufacturing method for the non-volatile memory device according to the present embodiment will be described.

For example, a silicon oxide film 12 is formed on a silicon substrate 10. The silicon oxide film 12 can be formed by various kinds of film forming methods, such as thermal oxidation and chemical oxidation to the silicon substrate 10, or a chemical vapor deposition (CVD) method, and a sputtering method.

Next, the first electrode wiring 14 is formed on the silicon oxide film 12 by known film forming method and patterning method.

Next, for example, a TiN film 22 is formed on the first electrode wiring 14. The film forming method may be any one of the CVD method, an atomic layer deposition (ALD) method, the sputtering method, an evaporation method, an electron beam (EB) method, an application method, a hydrothermal synthesis method, and the like.

Next, a silicon oxide film 24 is formed on the TiN film 22. The film forming method may be any one of the CVD method, ALD method, sputtering method, evaporation method, EB method, and the like.

Next, a hafnium oxide film 26 to be the ferroelectric film is formed on the silicon oxide film 24. The hafnium oxide film 26 has a composition such as $Hf_{1-x}M_xO_{2-y}$. Here, M is one or more of Si, Y, Zr, Al, Sr, Ba, Ca, Gd, La, Ce, Pr, Nd, Sm, Eu, Tb, Dy, Ho, Er, Tm, Yb, Lu, and Sc. In the case of M Zr, x satisfies the condition of $0 \leq x \leq 0.25$, and Zr may be included at 2% or less of Hf entering an Hf site as impurities separately. Further, in the case of M=Zr, x and y satisfy the following conditions: $0.45 \leq x \leq 0.55$ and $0 \leq y \leq 0.1$.

A crystal structure of the hafnium oxide film 26 to be the ferroelectric film is $Pbc2_1$ of the space group number 29 or Pbca of the space group number 61. However, another crystal structure is also applicable at the time of film forming as long as a final crystal structure becomes $Pbc2_1$ of the space group number 29 or Pbca of the space group number 61.

From the viewpoint of properties as the ferroelectric substance, preferably, the hafnium oxide film 26 is a single crystal. For example, the hafnium oxide film 26 can be epitaxially grown on the insulating film 24 by forming the insulating film 24 as the single crystal such as $Ln_2O_3$ and MgO. Of course, from the viewpoint of the manufacturing cost, it is also possible to apply a polycrystalline film that can be manufactured at the lower cost than the single-crystal film.

In the case of forming the hafnium oxide film 26 by the sputtering method, a substrate temperature is preferably a room temperature, but the film can also be formed at a high temperature. Preferable sputtering conditions are film forming conditions not damaging the substrate: for example, the film is formed at sputtering gas pressure of 1 Pa or more, and the substrate and a target are arranged off-axially.

A method of performing chemical conversion sputtering in a $Ar+O_2$ atmosphere by using Hf metal as the sputtering target may also be applied. In this case, a gas flow rate ratio of $Ar:O_2$ is preferably 10:1 or less.

Since the hafnium oxide film 26 formed by the sputtering method is initially in an amorphous state immediately after film forming, presumably ferroelectricity is not realized yet. The timing when the ferroelectricity is realized in the hafnium oxide film 26 is when heat treatment is performed after film forming. The reason may be that the crystal structure of the hafnium oxide film 26 is changed to $Pbc2_1$ of the space group number 29 or Pbca of the space group number 61.

When an XPS spectrum of the hafnium oxide film 26 is obtained after the heat treatment, for example, peaks of positive trivalence, positive divalence, and positive monovalence of Hf smaller than positive tetravalence of Hf are observed at 4f peak of Hf. Here, note that ferroelectricity is not realized under the sputtering condition that zero-valence of Hf, more specifically, a peak of Hf metal is observed. From the viewpoint of developing ferroelectricity, it is preferable that the peak of positive monovalence is also as little as possible, and it is desirable that the peak of positive divalence is less than the peak of positive trivalence. There may be no peaks of positive divalence and positive monovalence. Further, there may be a peak of, for example, a valence smaller than a natural valence of a metal M (M is one or more of Si, Y, Zr, Al, Sr, Ba, Ca, Gd, La, Ce, Pr, Nd, Sm, Eu, Tb, Dy, Ho, Er, Tm, Yb, Lu, and Sc).

In order to achieve the above-described conditions in the XPS, for example, the film formed of the Hf metal or metal M (M is one or more of Si, Y, Zr, Al, Sr, Ba, Ca, Gd, La, Ce, Pr, Nd, Sm, Eu, Tb, Dy, Ho, Er, Tm, Yb, Lu, and Sc) having a film thickness of such as about 0.5 nm, more specifically, the film of about several atomic layers can be formed before or after forming the hafnium oxide film 26.

In the case where the hafnium oxide film 26 is formed by any one of the film forming methods on the above-described Hf metal film or metal M film, or in the case where the above-described Hf metal film or metal M film is formed on the hafnium oxide film 26, the Hf metal film and the $HfO_2$ film are mixed by heat treatment in the subsequent manufacturing step, and an the peak of Hf having the low valence can be observed in the XPS.

Next, a TiN film 28 is formed on the hafnium oxide film 26. The film forming method may be any one of the CVD method, ALD method, sputtering method, evaporation method, EB method, application method, hydrothermal synthesis method, and the like.

Next, a RuO film 30 is formed on the TiN film 28. The film forming method may be anyone of the CVD method, ALD method, sputtering method, evaporation method, EB method, application method, hydrothermal synthesis method, and the like.

Next, patterning is applied to the TiN film 22, silicon oxide film 24, hafnium oxide film 26, TiN film 28, and RuO film 30 by a known process, thereby forming the structure of the memory cell 101.

Subsequently, the second electrode wiring 16 is formed on the RuO film 30 by the known film forming method and patterning method.

After that, heat treatment is applied at 600° C. or more and 800° C. or less for 20 seconds or less, for example. Note that heat treatment can be applied after forming the RuO film 30 and before forming the second electrode wiring 16. In any step of manufacturing process up to here, oxygen atoms having the number less than the number of Ti atoms may be included in both or one of the TiN film 22 and the TiN film 28.

Meanwhile, in the non-volatile memory device according to the present embodiment, the first electrode wiring 14 and the first low oxygen concentration conductive layer (first conductive layer) 22 or the second electrode wiring 16 and the high oxygen concentration conductive layer (third conductive layer) 30 can be commonalized. More specifically, the first electrode wiring 14 itself may become the first low oxygen concentration conductive layer (first conductive layer) 22, or the second electrode wiring 16 itself may become the high oxygen concentration conductive layer (third conductive layer) 30 as well.

In the following, functions and effects of the non-volatile memory device according to the present embodiment will be described.

Hafnium oxide does not include elements such as Ba and Pb, and has high consistency with the semiconductor process such as the CMOS. Of course, same as other ferroelectric films, there may be problems in that polarization degradation is caused by repeated polarizing operation and endurance characteristics are deteriorated. This may be caused by oxygen defect generated inside hafnium oxide. Especially, in the FTJ device, Fowler-Nordheim (FN) tunnel current is made to flow in the ferroelectric film for memory cell operation. Therefore, oxygen defect may be promoted by electron hole trap, stress induced leakage current (SILC), and the like. On the other hand, when the content of oxygen become too high inside the hafnium oxide, ferroelectricity is not realized in the hafnium oxide.

In the FTJ device according to the present embodiment, as illustrated in FIG. 1, the conductive layer contacting the hafnium oxide film 26 is the second low oxygen concentration conductive layer 28 having the low content of oxygen. Due to this, while the FTJ device is manufactured or being operated, the second low oxygen concentration conductive layer 28 functions as an oxygen absorption layer to absorb oxygen in the hafnium oxide film 26. Therefore, the content of oxygen in the hafnium oxide film 26 is prevented from being excessively high. As a result, ferroelectricity is realized and kept in the hafnium oxide film 26.

Further, in the FTJ device according to the present embodiment, the high oxygen concentration conductive layer 30 having the high content of oxygen is provided by interposing the second low oxygen concentration conductive layer 28 having the low content of oxygen in the space with the hafnium oxide film 26. By providing the high oxygen concentration conductive layer 30 having the high content of oxygen, the high oxygen concentration conductive layer 30 functions as an oxygen supply layer to supply oxygen to the hafnium oxide film 26 while the FTJ device is operated. Therefore, oxygen defect generated in the hafnium oxide film 26 is partly fixed by supplying a small amount of oxygen to the hafnium oxide film 26. As a result, endurance characteristics of the FTJ device are improved.

The FTJ device having the structure according to the present embodiment is manufactured by the above-described manufacturing method. The hafnium oxide film is formed by the above-described sputtering method. The memory cell has the film structure in which the TiN film, silicon oxide film, hafnium oxide film, TiN film, and RuO film are stacked from the first electrode wiring 14.

An X-ray diffraction test using radiated light is performed on the hafnium oxide film of this FTJ device, and it is found that $Pbc2_1$ is a main component of the crystal structure of the hafnium oxide film. Meanwhile, even in the case where a Pbca crystal structure, P42/nmc crystal structure, a Fm3m crystal structure, and P21/c crystal structure are included as accessory components, ferroelectricity can be obtained.

Further, when the TiN film contacting the hafnium oxide film is observed by the XPS, a TEM-EDX, or the like, it is found that a small amount of oxygen is included in the TiN film. Presumably, ferroelectricity is realized because the hafnium oxide film comes to have the Pbc21 crystal structure by oxygen in the hafnium oxide film moving to the TiN film during manufacture.

Current voltage (IV) measurement is performed for the above-described FTJ device while applying voltage between the first electrode wiring 14 and the second electrode wiring 16 such that the voltage changes from 0 V to +4 V, and then to 0 V after passing −4 V and +4 V. As a result, hysteresis of the tunnel current value is observed.

More specifically, current of about 1 pA is observed proportional to the voltage when the tunnel current value is first measured while increasing the voltage from 0 V to nearly +3 V. Next, when the voltage is increased up to +4 V exceeding +3 V or so, the tunnel current is increased exponentially. Therefore, presumably, the tunnel current that is an operating principle of the FTJ device observed in this area.

Next, when the voltage is decreased from +4 V to +2.5 V or so, the tunnel current is decreased exponentially. Further, the current measured while decreasing the voltage from +4 V to about +2.5 V is almost ten times larger, compared with the current previously measured while increasing the voltage from about +3 V up to +4 V.

The reason may be that the tunnel current is modulated because polarization of the hafnium oxide film 26 is reversed at about +2 V while increasing the voltage from 0 V to +4 V, and afterward the reversed polarization is kept as it is while decreasing the voltage from +4 V to 0 V.

When the voltage is increased up to 0 V after decreasing the voltage from +2.5 V to −4 V, current of about 1 pA is observed proportional to the voltage. This may be because polarization of the hafnium oxide film 26 is reversed again at about −2 V while decreasing the voltage.

Actually, when the voltage is increased again from 0 V to +4 V, a voltage-current curve at the time of initially increasing the voltage is almost reproduced. After that, when the voltage is decreased from +4 V to 0 V, a voltage-current curve at the time of initially decreasing the voltage is almost reproduced. Since the current at this point, for example, the current at the time of increasing the voltage around +3 V is different from the current at the time of decreasing the voltage by almost ten times, operation as the non-volatile memory device is confirmed.

Further, comparing the endurance characteristics of the above-manufactured FTJ device with an FTJ device without having a RuO film that is the high oxygen concentration conductive layer, it is confirmed that the endurance characteristics are improved.

As described above, according to the present embodiment, the non-volatile memory device having the improved endurance characteristics can be implemented.

(First Modified Example)

Figure 3:
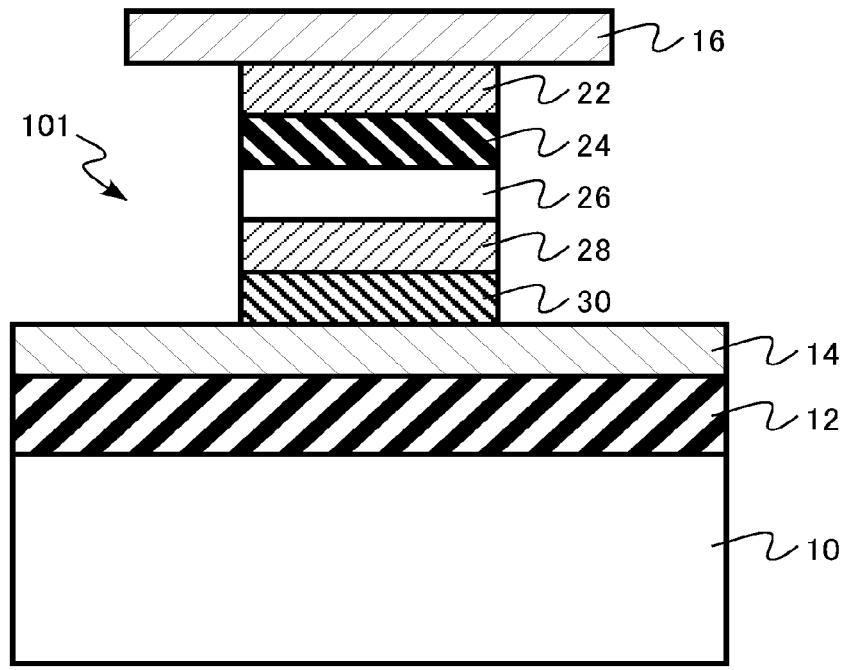
FIG. 3 is a schematic cross-sectional view illustrating a memory cell portion of a non-volatile memory device according to a first modified example of the first embodiment.

FIG. 3 is a schematic cross-sectional view illustrating a memory cell portion of a non-volatile memory device according to a first modified example of the first embodiment. According to the present modified example, a stacking structure of the memory cell 101 in an inverse order of the first embodiment.

More specifically, as illustrated in FIG. 3, the memory cell 101 has a structure in which the high oxygen concentration conductive layer (third conductive layer) 30, second low oxygen concentration conductive layer (second conductive layer) 28, ferroelectric film 26 of hafnium oxide, insulating film 24, and first low oxygen concentration conductive layer (first conductive layer) 22 are stacked in a direction from the first electrode wiring 14 side to the second electrode wiring 16.

According to the present modified example also, effects same as the non-volatile memory device according to the first embodiment can be obtained.

(Second Modified Example)

Figure 4:
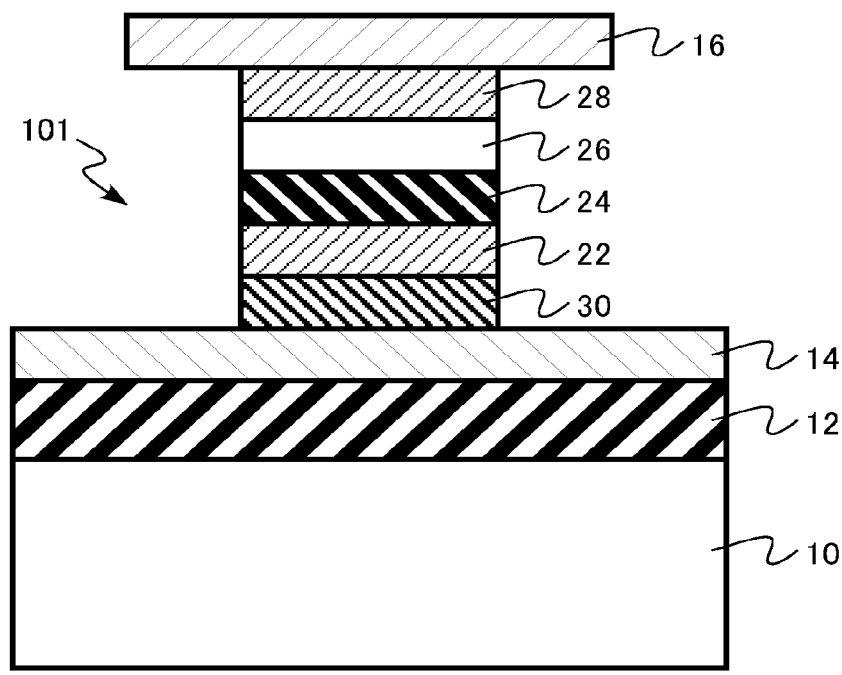
FIG. 4 is a schematic cross-sectional view illustrating a memory cell portion of a non-volatile memory device according to a second modified example of the first embodiment.

FIG. 4 is a schematic cross-sectional view illustrating a memory cell portion of a non-volatile memory device according to a second modified example of the first embodiment. The present modified example differs from the first embodiment in that the high oxygen concentration conductive layer 30 (third conductive layer) is provided on the first electrode wiring 14 side.

More specifically, as illustrated in FIG. 4, the memory cell 101 has a structure in which the high oxygen concentration conductive layer (third conductive layer) 30, first low oxygen concentration conductive layer (first conductive layer) 22, insulating film 24, ferroelectric film 26 of hafnium oxide, second low oxygen concentration conductive layer (second conductive layer) 28 are stacked in a direction from the first electrode wiring 14 side to the second electrode wiring 16.

According to the present modified example also, effects same as the non-volatile memory device according to the first embodiment can be obtained.

(Third Modified Example)

Figure 5:
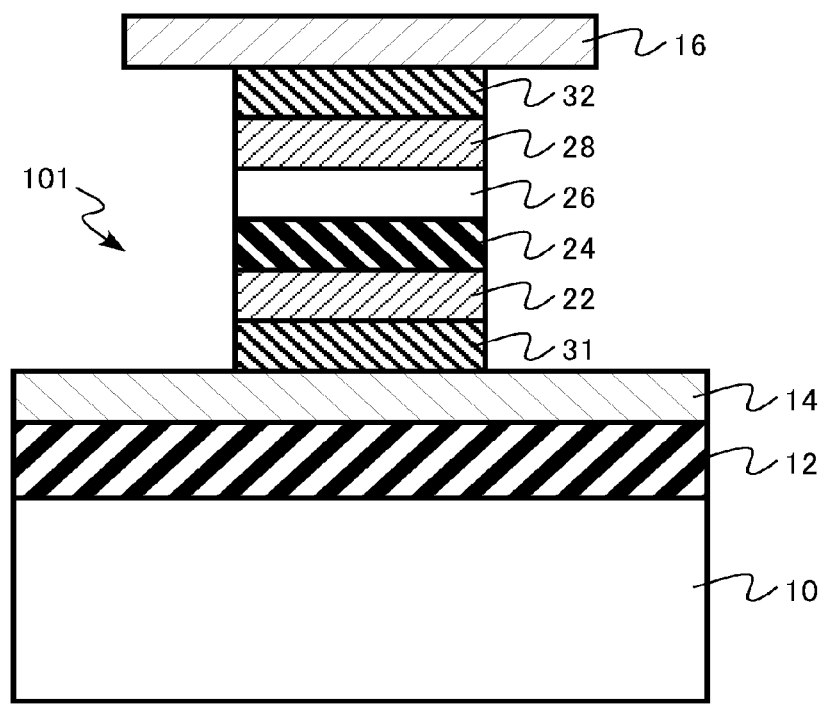
FIG. 5 is a schematic cross-sectional view illustrating a memory cell portion of a non-volatile memory device according to a third modified example of the first embodiment.

FIG. 5 is a schematic cross-sectional view illustrating a memory cell portion of a non-volatile memory device according to a third modified example of the first embodiment. The present modified example differs from the first embodiment in including third conductive layers of metal oxide provided on opposite sides of ferroelectric films of both of the first conductive layer and the second conductive layer in a manner contacting the first conductive layer or the second conductive layer, in which a value obtained by multiplying the number of oxygen ions inside the layer by a valence 2 of oxygen is larger than a value obtaining by multiplying the number of positive ions by a valence of the positive ion.

More specifically, as illustrated in FIG. 5, the memory cell 101 has a structure in which a first high oxygen concentration conductive layer (third conductive layer) 31, the first low oxygen concentration conductive layer (first conductive layer) 22, the insulating film 24, the ferroelectric film 26 of hafnium oxide, the second low oxygen concentration conductive layer (second conductive layer) 28, and a second high oxygen concentration conductive layer (third conductive layer) 32 are stacked in a direction from the first electrode wiring 14 side to the second electrode wiring 16.

Meanwhile, the first high oxygen concentration conductive layer 31 and the second high oxygen concentration conductive layer 32 may be formed of either the same material or different materials.

According to the present modified example also, effects same as the non-volatile memory device according to the first embodiment can be obtained. Further, the structure of the present modified example is a preferable in the case where a supply amount of oxygen to the ferroelectric film 26 is needed to be increased.

(Fourth Modified Example)

Figure 6:
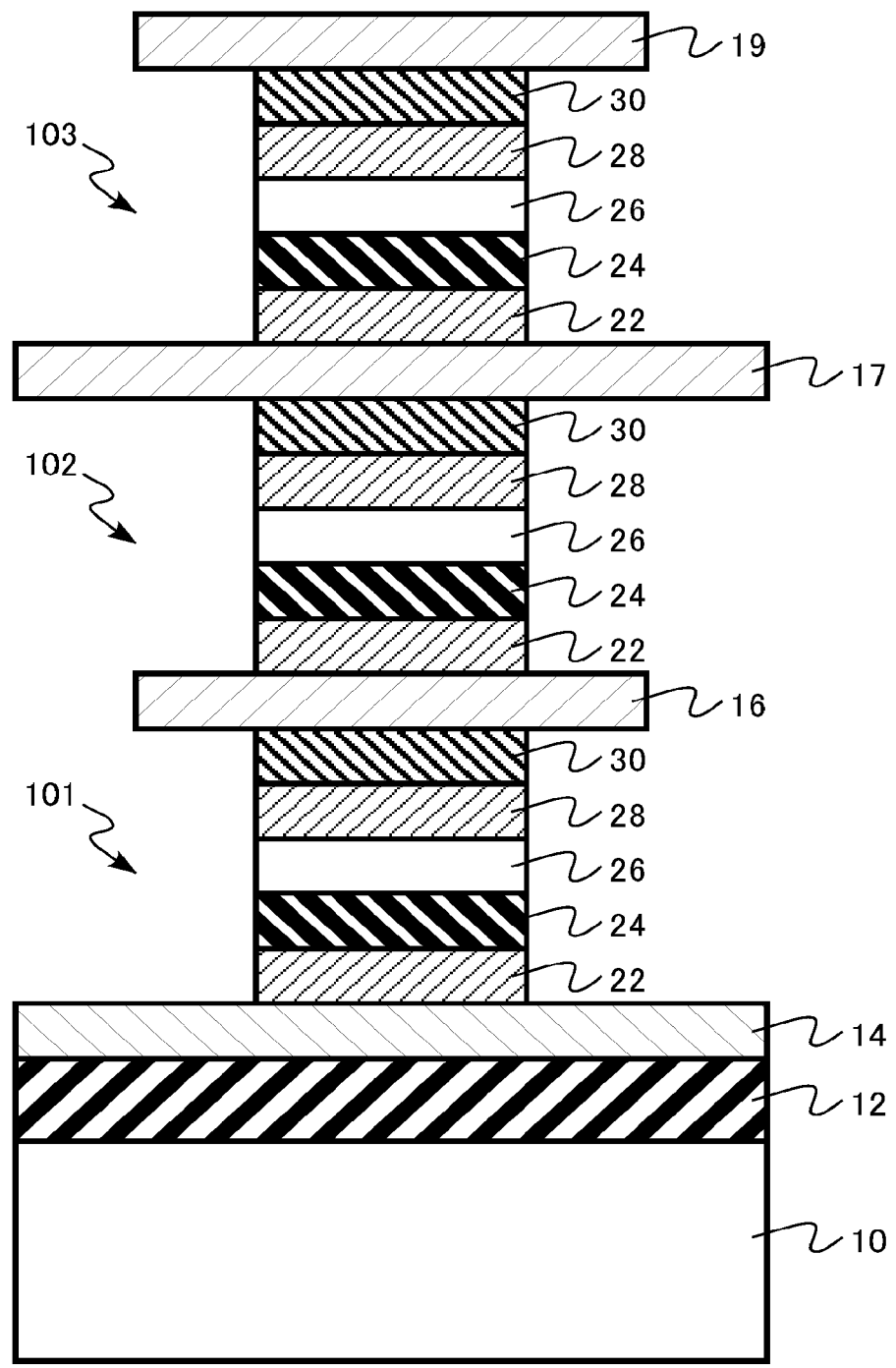
FIG. 6 is a schematic cross-sectional view illustrating a memory cell portion of a non-volatile memory device according to a fourth modified example of the first embodiment.

FIG. 6 is a schematic cross-sectional view illustrating a memory cell portion of a non-volatile memory device according to a fourth modified example of the first embodiment. The present modified example differs from the first embodiment in including a three-dimensional structure in which the memory cells are stacked in multiple levels.

More specifically, a memory cell 102 is provided on the memory cell 101 via the second electrode wiring 16. Further, a memory cell 103 is provided on the memory cell 102 via third electrode wiring 17. Fourth electrode wiring 19 is provided on the memory cell 103.

According to the present modified example also, effects same as the non-volatile memory device according to the first embodiment can be obtained. Further, integration of memory cells is improved by three-dimensionally stacking the memory cells.

Meanwhile, in FIG. 6, all of the memory cell 101, memory cell 102, and memory cell 103 have the same stacking structure, but the memory cells do not necessarily have the same structure. For example, the memory cell 102 can be a memory cell having a stacking structure in the inverse order of the first modified example. Further, the example of stacking three levels of the memory cells has been described in FIG. 6, but two levels or four or more levels may be stacked, too.

(Second Embodiment) A non-volatile memory device according to the present embodiment includes: a first conductive layer including metal oxide, the metal oxide having oxygen ratio larger than stoichiometric ratio; a second conductive layer including metal nitride, the metal nitride absorbing oxygen; a paraelectric layer disposed between the first conductive layer and the second conductive layer; a ferroelectric layer disposed between the paraelectric layer and the second conductive layer, the ferroelectric layer including hafnium oxide; and a sense circuit configured to read data based on tunneling current flow between the first conductive layer and the second conductive layer through the paraelectric layer and the ferroelectric layer. A non-volatile memory device according to the present embodiment includes: a first conductive layer of metal oxide in which a value obtained by multiplying the number of ions inside the layer by a valence 2 of oxygen is larger than a value obtained by multiplying the number of positive ions by a valence of the positive ion; an insulating film provided in a manner contacting the first conductive layer; a ferroelectric film of hafnium oxide provided on an opposite side of the first conductive layer of the insulating film in a manner contacting the insulating film; and a second conductive layer provided on an opposite side of the insulating film of the ferroelectric film in a manner contacting the ferroelectric film, in which a value obtained by multiplying the number of oxygen ions inside the layer by a valence 2 of oxygen is smaller than a value obtained by multiplying the number of positive ions by a valence of the positive ion.

The non-volatile memory device according to the present embodiment differs from the second modified example of a first embodiment in not including a low oxygen concentration conductive layer between the insulating film and the high oxygen concentration conductive layer. In the following, a description for the matters overlapping with the first embodiment will be omitted.

Figure 7:
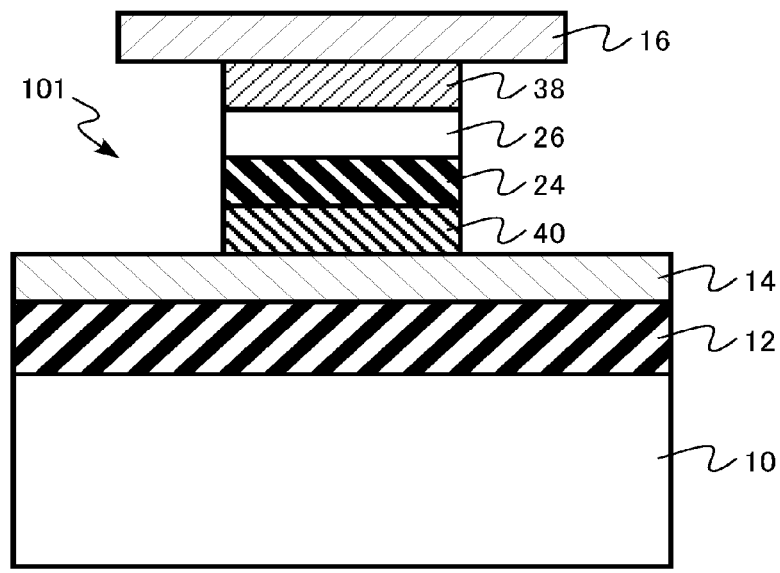
FIG. 7 is a schematic cross-sectional view illustrating a memory cell portion of a non-volatile memory device according to a second embodiment.

FIG. 7 is a schematic cross-sectional view illustrating a memory cell portion of the non-volatile memory device according to the present embodiment. As illustrated in FIG. 7, a memory cell 101 has a structure in which a high oxygen concentration conductive layer (first conductive layer) 40 of metal oxide, an insulating film 24, a ferroelectric film 26 of hafnium oxide, and a low oxygen concentration conductive layer (second conductive layer) 38 are stacked in a direction from first electrode wiring 14 side to second electrode wiring 16.

In the low oxygen concentration conductive layer (second conductive layer) 38, a value obtained by multiplying the number of oxygen ions inside the layer by a valence 2 of oxygen is smaller than a value obtained by multiplying the number of positive ions by a valence of the positive ion.

According to the present embodiment, the low oxygen concentration conductive layer 38 functions as an oxygen absorption layer. Further, the high oxygen concentration conductive layer 40 functions as an oxygen supply layer.

Meanwhile, since the insulating film 24 is interposed between the ferroelectric film 26 and the high oxygen concentration conductive layer 40, the high oxygen concentration conductive layer 40 is prevented from excessively supplying oxygen to the ferroelectric film 26.

According to the present embodiment, the non-volatile memory device having improved endurance characteristics can be implemented. Further, compared to the first embodiment, for example, the structure of the present embodiment is preferable in the case where a supply amount of oxygen to the ferroelectric film 26 is needed to be increased.

(Modified Example)

Figure 8:
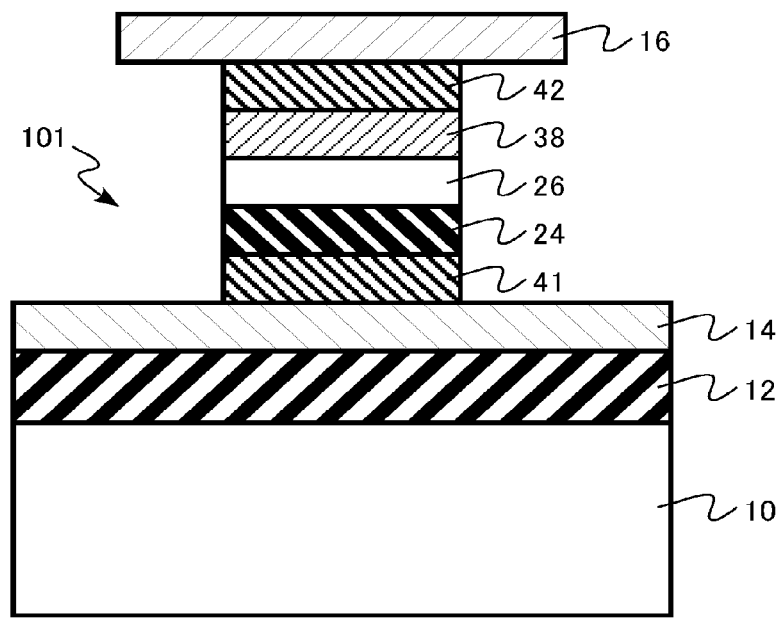
FIG. 8 is a schematic cross-sectional view illustrating a memory cell portion of a non-volatile memory device according to a modified example of the second embodiment.

FIG. 8 is a schematic cross-sectional view illustrating a memory cell portion of a non-volatile memory device according to a modified example of the second embodiment. The present modified example differs from the second embodiment in further including a third conductive layer of metal oxide provided on an opposite side of the ferroelectric film of the second conductive layer in a manner contacting the second conductive layer, in which a value obtained by multiplying the number of oxygen ions inside the layer by a valence 2 of oxygen is larger than a value obtained by multiplying the number of positive ions by a valence of the positive ion.

More specifically, as illustrated in FIG. 8, the memory cell 101 has a structure in which a first high oxygen concentration conductive layer (first conductive layer) 41 of metal oxide, the insulating film 24, the ferroelectric film 26 of hafnium oxide, the low oxygen concentration conductive layer (second conductive layer) 38, and a second high oxygen concentration conductive layer (third conductive layer) 42 are stacked in a direction from the first electrode wiring 14 side to the second electrode wiring 16.

Meanwhile, the first high oxygen concentration conductive layer 41 and the second high oxygen concentration conductive layer 42 may be formed of either the same material or different materials.

According to the present modified example, not only the first high oxygen concentration conductive layer 41 but also the second high oxygen concentration conductive layer 42 function as the oxygen supply layers. Therefore, the structure of the present modified example is preferable in the case where the oxygen supply amount to the ferroelectric film 26 is needed to be further increased.

(Third Embodiment) A non-volatile memory device according to the present embodiment includes: a first conductive layer including a first metal nitride, the first metal nitride absorbing oxygen; a second conductive layer including a second metal nitride, the second metal nitride absorbing oxygen, the second metal nitride having a work function different from the first metal nitride; a ferroelectric layer disposed between the first conductive layer and the second conductive layer, the ferroelectric layer including hafnium oxide; at least one third conductive layer disposed on opposite side of at least one of the first conductive layer and the second conductive layer to the ferroelectric layer, the at least one third conductive layer including metal oxide, the metal oxide having oxygen ratio larger than stoichiometric ratio; and a sense circuit configured to read data based on tunneling current flow between the first conductive layer and the second conductive layer through the ferroelectric layer. A non-volatile memory device according to the present embodiment includes: a first conductive layer in which a value obtained by multiplying the number of oxygen ions inside the layer by a valence 2 of oxygen is smaller than a value obtained by multiplying the number of positive ions by a valence of the positive ion; a ferroelectric film of hafnium oxide provided in a manner contacting the first conductive layer; a second conductive layer provided on an opposite side of the first conductive layer of the ferroelectric film in a manner contacting the ferroelectric film and having a work function different from the first conductive layer, in which a value obtained by multiplying the number of oxygen ions inside the layer by a valence 2 of oxygen is smaller than a value obtained by multiplying the number of positive ions by a valence of the positive ion; and a third conductive layer of metal oxide provided on an opposite side of the ferroelectric film of one or both of the first conductive layer and the second conductive layer in a manner contacting the first conductive layer or the second conductive layer, in which a value obtained by multiplying the number of oxygen ions inside the layer by a valence 2 of oxygen is larger than a value obtained by multiplying the number of positive ions by a valence of the positive ion.

The non-volatile memory device of the present embodiment differs from the first embodiment in not including an insulating film between the first conductive layer and the second conductive layer. In the following, a description for the matters overlapping with the first embodiment will be omitted.

Figure 9:
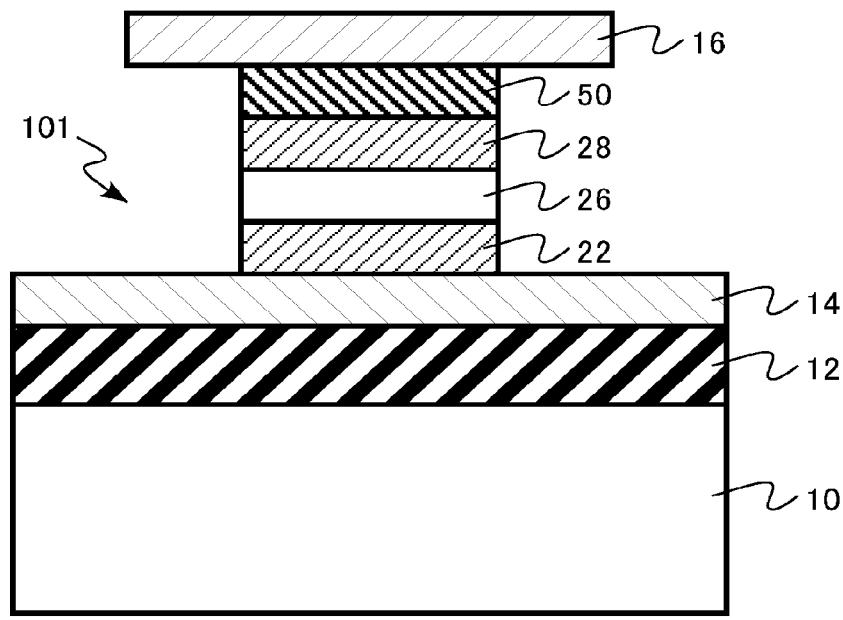
FIG. 9 is a schematic cross-sectional view illustrating a memory cell portion of a non-volatile memory device according to a third embodiment.

FIG. 9 is a schematic cross-sectional view illustrating a memory cell portion of the non-volatile memory device according to the present embodiment. As illustrated in FIG. 9, the memory cell 101 has a structure in which a first low oxygen concentration conductive layer (first conductive layer) 22, a ferroelectric film 26 of hafnium oxide, a second low oxygen concentration conductive layer (second conductive layer) 28, and a high oxygen concentration conductive layer (third conductive layer) 50 are stacked in a direction from first electrode wiring 14 side to second electrode wiring 16.

The second low oxygen concentration conductive layer 28 has a work function different from the first low oxygen concentration conductive layer 22. Therefore, a Schottky barrier height between the ferroelectric film 26 and the first low oxygen concentration conductive layer 22 is different from a Schottky barrier height between the ferroelectric film 26 and the second low oxygen concentration conductive layer 28. Thus, since the ferroelectric film 26 is interposed between the conductive layers having the different work functions, an FTJ device has a diode function, more specifically, a rectification property.

In the high oxygen concentration conductive layer (third conductive layer) 50, the value obtained by multiplying the number of oxygen ions inside the layer by the valence 2 of oxygen is larger than the value obtained by multiplying the number of positive ions by the valence of the positive ion.

According to the present embodiment, the first low oxygen concentration conductive layer 22 and the second low oxygen concentration conductive layer 28 function as oxygen absorption layers. Further, the high oxygen concentration conductive layer 50 functions as an oxygen supply layer.

According to the present embodiment, the non-volatile memory device having improved endurance characteristics can be implemented. Further, since the rectification property can be obtained without using any insulating film, the device can be scaled down.

(Modified Example)

Figure 10:
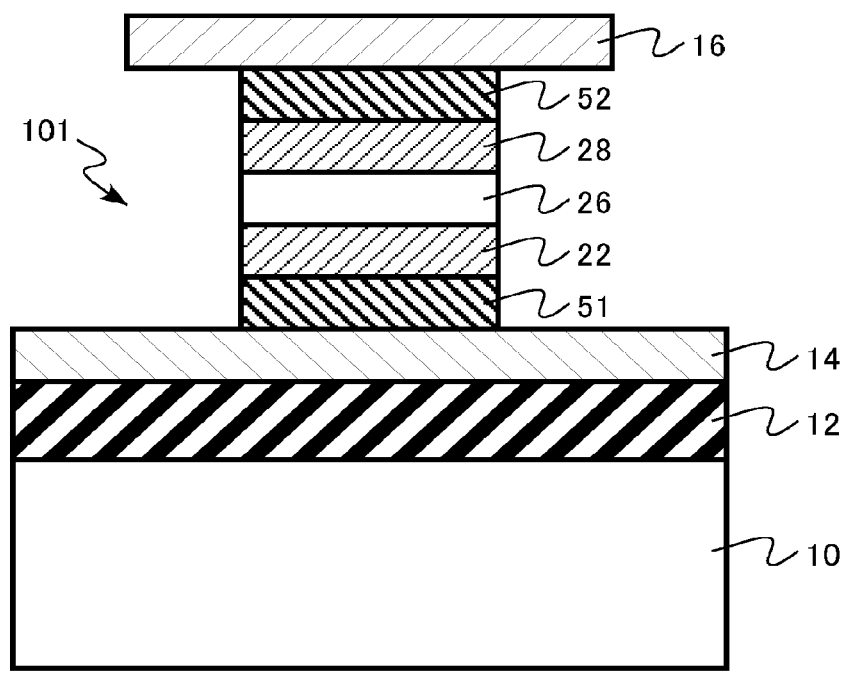
FIG. 10 is a schematic cross-sectional view illustrating a memory cell portion of a non-volatile memory device according to a modified example of the third embodiment.

FIG. 10 is a schematic cross-sectional view illustrating a memory cell portion of a non-volatile memory device according to a modified example of the third embodiment. The present modified example differs from the third embodiment in including third conductive layers of metal oxide provided on opposite side of ferroelectric film of both of the first conductive layer and the second conductive layer in a manner contacting the first conductive layer or the second conductive layer, in which the value obtained by multiplying the number of oxygen ions inside the layer by a valence 2 of oxygen is larger than the value obtaining by multiplying the number of positive ions by a valence of the positive ion.

More specifically, as illustrated in FIG. 10, the memory cell 101 has a structure in which a first high oxygen concentration conductive layer (third conductive layer) 51 of metal oxide, the first low oxygen concentration conductive layer (first conductive layer) 22, the ferroelectric film 26 of hafnium oxide, the second low oxygen concentration conductive layer (second conductive layer) 28, and a second high oxygen concentration conductive layer (third conductive layer) 52 are stacked in a direction from the first electrode wiring 14 side to the second electrode wiring 16.

Meanwhile, the first high oxygen concentration conductive layer 51 and second high oxygen concentration conductive layer 52 may be formed of either the same material or different materials.

According to the present modified example, not only the first high oxygen concentration conductive layer 51 but also the second high oxygen concentration conductive layer 52 function as the oxygen supply layers. Therefore, the structure of the present modified example is preferable in the case where the oxygen supply amount to the ferroelectric film 26 is needed to be further increased.

(Fourth Embodiment) A non-volatile memory device according to the present embodiment includes: a first conductive layer; a second conductive layer including metal nitride, the metal nitride absorbing oxygen; an insulating layer disposed between the first conductive layer and the second conductive layer, the insulating layer having oxygen non-stoichiometric composition; a ferroelectric layer disposed between the insulating layer and the second conductive layer, the ferroelectric layer including hafnium oxide; and a sense circuit configured to read data based on tunneling current flow between the first conductive layer and the second conductive layer through the insulating layer and the ferroelectric layer. A non-volatile memory device according to the present embodiment includes: a first conductive layer; an insulating film having oxygen non-stoichiometric composition and provided in a manner contacting the first conductive layer; a ferroelectric film of hafnium oxide provided on an opposite side of the first conductive layer of the insulating film in a manner contacting the insulating film; and a second conductive layer provided on an opposite side of the insulating film of the ferroelectric film in a manner contacting the ferroelectric film, in which a value obtained by multiplying the number of oxygen ions inside the layer by a valence 2 of oxygen is smaller than a value obtained by multiplying the number of positive ions by a valence of the positive ion.

The non-volatile memory device according to the present embodiment differs from the first embodiment in that the insulating film has the oxygen non-stoichiometric composition. In the following, a description for the matters overlapping with the first embodiment will be omitted.

Figure 11:
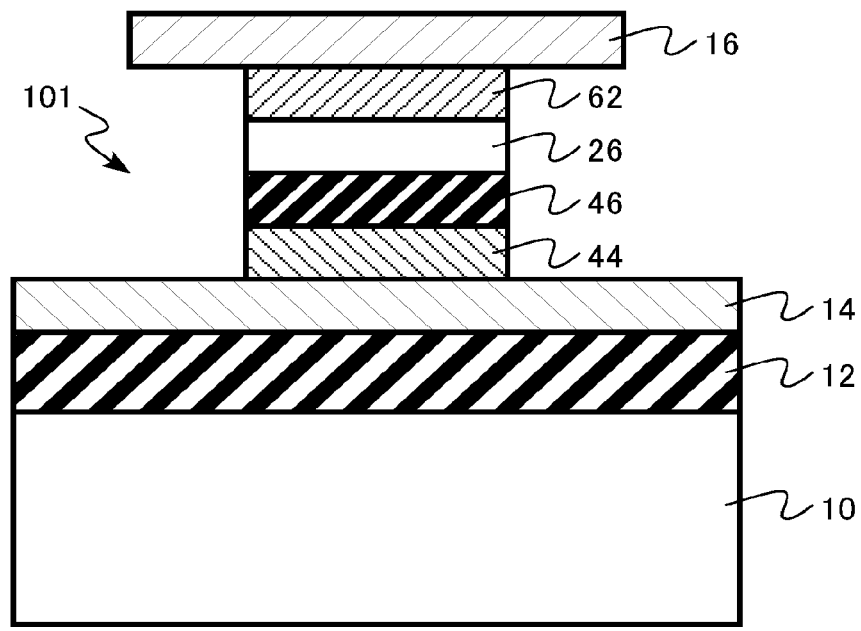
FIG. 11 is a schematic cross-sectional view illustrating a memory cell portion of a non-volatile memory device according to a fourth embodiment.

FIG. 11 is a schematic cross-sectional view illustrating a memory cell portion of the non-volatile memory device according to the present embodiment. As illustrated in FIG. 11, a memory cell 101 has a structure in which a metal layer (first conductive layer) 44, an insulating film 46 having the oxygen non-stoichiometric composition, a ferroelectric film 26 of hafnium oxide, and a low oxygen concentration conductive layer (second conductive layer) 62 are stacked in a direction from first electrode wiring 14 side to second electrode wiring 16.

In the low oxygen concentration conductive layer (second conductive layer) 62, the value obtained by multiplying the number of oxygen ions inside the layer by the valence 2 of oxygen is smaller than the value obtained by multiplying the number of positive ions by the valence of the positive ion.

Exemplary materials of the metal layer (first conductive layer) 44 are Cu, Al, Ta, Mo, TiN, TaN, MoN, etc. Besides the above materials, for example, Ru, Ir, Os, Pt, Rh, Pd, Nb, W, Hf, Zr, Re, Ti, Ni, Co, Fe, Mn, Cr, V, Ti, graphene, amorphous carbon, CuN, CuAlN, SrN, BaN, SrAlN, BaAlN, TiN, ZrN, HfN, TiAlN, ZrAlN, HfAlN, VN, NbN, VAlN, NbAlN, TaAlN, CrN, WN, CrAlN, MoAlN, WAlN, MnN, MnAlN, ReN, ReAlN, FeN, FeN, CoN, CoN, NiN, CuSi, MgSi, CaSi, SrSi, BaSi, LnSi (Ln is one or more of La, Ce, Pr, Nd, Sm, Eu, Gd, Tb, Dy, Ho, Er, Tm, Yb, L), TiSi, ZrSi, HfSi, VSi, NbSi, TaSi, CrSi, MoSi, WSi, MnSi, FeSi, CoSi, NiSi, CaC, SrC, BaC, BC, AlC, SiC, TiC, ZrC, HfC, VC, NbC, TaC, CrC, MoC, WC, MnC, ReC, MgB, CaB, SrB, BaB, AlB, LnB (Ln is one or more of La, Ce, Pr, Nd, Sm, Eu, Gd, Tb, Dy, Ho, Er, Tm, Yb, L), TiB, ZrB, HfB, NbB, TaB, MoB, WB, MnB, FeB, CoB, NiB, MgNi, CaNi, LnNi (Ln is one or more of La, Ce, Pr, Nd, Sm, Eu, Gd, Tb, Dy, Ho, Er, Tm, Yb, L), NiTi, NiZr, NiHf can be also used. Further, metal atoms that can be positive ions, or oxygen atoms that can be negative ions having the number less than the number of carbon atoms may also be included. Meanwhile, the first conductive layer 44 may also be a low oxygen concentration conductive layer in which a value obtained by multiplying the number of oxygen ions inside the layer by a valence 2 of oxygen is smaller than a value obtained by multiplying the number of positive ions by a valence of the positive ion.

The insulating film 46 having the oxygen non-stoichiometric composition has a property of changing oxygen composition inside the film from stoichiometric composition. Even when the oxygen composition inside the film is changed, the insulating film 46 having the oxygen non-stoichiometric composition does not lose insulation property.

Materials of the insulating film 46 having the oxygen non-stoichiometric composition are, for example, cerium oxide ($CeO_x$ ($1.5 \leq x \leq 2$)) and praseodymium oxide ($PrO_x$ ($1.5 \leq x \leq 2$)). A film forming method for the insulating film 46 having the oxygen non-stoichiometric composition may be any one of a CVD method, an ALD method, a sputtering method, an evaporation method, an EB method, and the like.

The insulating film 46 having the oxygen non-stoichiometric composition functions as a tunnel insulating film that allows carriers to flow as tunnel current at the time of writing, reading, and erasing data of the memory cell. Further, since the insulating film 24 is interposed, an FTJ device has a diode function, more specifically, a rectification property. From the viewpoint of stable operation of the memory cell 101, preferably, the insulating film 24 is a paraelectric film. However, in principle, the insulating film 24 is operable even in the case of using a ferroelectric film, an antiferroelectric film, a ferridielectric film, or the like formed of a material having conduction electron offset or valence electron offset different from the ferroelectric film 26.

Meanwhile, preferably, an effective oxide thickness (EOT) of the insulating film 46 is thinner than an EOT of the ferroelectric film 26. When the EOT of the insulating film 46 is thicker than the EOT of the upper layer that is the ferroelectric film 26, a sufficient electric field is hardly applied to the ferroelectric film 26 and polarization reversal is hardly caused at the ferroelectric film 26.

While writing is performed in the memory cell 101, the tunnel current flows in the insulating film 46. Therefore, when the writing electric field is excessively applied, the FTJ device may be broken. From this viewpoint, the EOT of the insulating film 46 is preferably thin. At the same time, preferably, the insulating film 46 is the material having high dielectric breakdown voltage.

The insulating film 46 has a film thickness of, for example, 0.5 nm or more and 3 nm or less.

As the material of the insulating film 46 having the oxygen non-stoichiometric composition, CePrOx ($3 \le x \le 4$) may be applied besides CeOx ($1.5 \le x \le 2$) and PrOx ($1.5 \le x \le 2$). Further, the material including one or more of amorphous, or $P2_1/c$ of space group number 14, $P4_2/nmc$ of space group number 137, Fm3m of space group number 225, Pbca of space group number 61, Pnma of space group number 62, or $Hf_{1-x-y}Zr_xM_yO_{(2-z)(1-w)}N_w$ of space group number 19 ($0 \le x \le 1$, $0 \le y \le 0.5$, $-0.1 \le z \le 0.2$, $0 \le w \le 0.7$ of $P2_12_12_1$, M is one or more of Si, Ge, B, Al, Ga, In, P, As, Bi, Mg, Ca, Sr, Ba, Zn, Cd, Ti, Ta, Mo, W, Sc, Y, La, Ce, Pr, Nd, Sm, Eu, Gd, Tb, Dy, Ho, Er, Tm, Yb, and Lu), $LnAlO_3$ (Ln is one or more of La, Ce, Pr, Nd, Sm, Eu, Gd, Tb, Dy, Ho, Er, Tm, Yb, and L), LnSiO (Ln is one or more of La, Ce, Pr, Nd, Sm, Eu, Gd, Tb, Dy, Ho, Er, Tm, Yb, and L) HfSiO, HfSiON, HfAlO, $Al_2O_3$, MgO, $Ln_2O_3$ (Ln is one or more of La, Pr, Nd, Sm, Eu, Gd, Tb, Dy, Ho, Er, Tm, Yb, and L), $CaF_2$, $SrF_2$, $BaF_2$, $LnF_3$ (Ln is one or more of La, Ce, Pr, Nd, Sm, Eu, Gd, Tb, Dy, Ho, Er, Tm, Yb, and L), and including CeOx ($1.5 \le x \le 2$) can be also applied. Otherwise, the material including one or more of amorphous or $P2_1/c$ of space group number 14, $P4_2/nmc$ of space group number 137, Fm3m of space group number 225, Pbca of space group number 61, Pnma of space group number 62, or $Hf_{1-x-y}Zr_xM_yO_{(2-z)(1-w)}N_w$ ($0 \le x \le 1$, $0 \le y \le 0.5$, $-0.1 \le z \le 0.2$, $0 \le w \le 0.7$ of $P2_12_12_1$ of space group number 19, M is one or more of Si, Ge, B, Al, Ga, In, P, As, Bi, Mg, Ca, Sr, Ba, Zn, Cd, Ti, Ta, Mo, W, Sc, Y, La, Ce, Pr, Nd, Sm, Eu, Gd, Tb, Dy, Ho, Er, Tm, Yb, and Lu) $LnAlO_3$ (Ln is one or more of La, Ce, Pr, Nd, Sm, Eu, Gd, Tb, Dy, Ho, Er, Tm, Yb, and L), LnSiO (Ln is one or more of La, Ce, Pr, Nd, Sm, Eu, Gd, Tb, Dy, Ho, Er, Tm, Yb, and L), HfSiO, HfSiON, HfAlO, $Al_2O_3$, MgO, $Ln_2O_3$ (Ln is one or more of La, Pr, Nd, Sm, Eu, Gd, Tb, Dy, Ho, Er, Tm, Yb, and L) $CaF_2$, $SrF_2$, $BaF_2$, $LnF_3$ (Ln is one or more of La, Ce, Pr, Nd, Sm, Eu, Gd, Tb, Dy, Ho, Er, Tm, Yb, and L), and including PrOx ($1.5 \le x \le 2$) can be also applied. Otherwise, for example, the material including one or more of amorphous, or $P2_1/c$ of space group number 14, $P4_2/nmc$ of space group number 137, Fm3m of space group number 225, Pbca of space group number 61, Pnma of space group number 62, or $Hf_{1-x-y}Zr_xM_yO_{(2-z)(1-w)}N_w$ of space group number 19 ($0 \le x \le 1$, $0 \le y \le 0.5$, $-0.1 \le z \le 0.2$, $0 \le w \le 0.7$ of $P2_12_12_1$. M is one or more of Si, Ge, B, Al, Ga, In, P, As, Bi, Mg, Ca, Sr, Ba, Zn, Cd, Ti, Ta, Mo, W, Sc, Y, La, Ce, Pr, Nd, Sm, Eu, Gd, Tb, Dy, Ho, Er, Tm, Yb, and Lu) $LnAlO_3$ (Ln is one or more of La, Ce, Pr, Nd, Sm, Eu, Gd, Tb, Dy, Ho, Er, Tm, Yb, and L), LnSiO (Ln is one or more of La, Ce, Pr, Nd, Sm, Eu, Gd, Tb, Dy, Ho, Er, Tm, Yb, and L) HfSiO, HfSiON, HfAlO, $Al_2O_3$, MgO, $Ln_2O_3$ (Ln is one or more of La, Pr, Nd, Sm, Eu, Gd, Tb, Dy, Ho, Er, Tm, Yb, and L), $CaF_2$, $SrF_2$, $BaF_2$, $LnF_3$ (Ln is one or more of La, Ce, Pr, Nd, Sm, Eu, Gd, Tb, Dy, Ho, Er, Tm, Yb, and L), and including CePrOx (however, $3 \le x \le 4$) can be also applied.

According to the present embodiment, the low oxygen concentration conductive layer (second conductive layer) 62 functions as an oxygen absorption layer. Further, the insulating film 46 having the oxygen non-stoichiometric composition functions as an oxygen buffer layer.

More specifically, in the case where oxygen is excessive inside the hafnium oxide film 26, the insulating film 46 having the oxygen non-stoichiometric composition functions as the oxygen absorption layer. In the case where oxygen is short inside the hafnium oxide film 26, the insulating film 46 functions as the oxygen supply layer. Therefore, while the FTJ device is manufactured or being operated, oxygen inside the hafnium oxide film 26 is prevented from being excessive or short. Therefore, ferroelectricity of the hafnium oxide film 26 is realized and kept, and further the endurance characteristics of the FTJ device are improved.

Meanwhile, the insulating film 46 having the oxygen non-stoichiometric composition preferably includes a positive ion having electronegativity lower than hafnium (Hf). By including the positive ion having the electronegativity lower than hafnium (Hf), the insulating film 46 can easily absorb oxygen in the case where oxygen is excessive inside the hafnium oxide film 26.

According to the present embodiment, the non-volatile memory device having improved endurance characteristics can be implemented. Further, since the insulating film 46 can be used as the oxygen supply layer, the number of layers in the stacking structure of the memory cell 101 can be reduced. As a result, the device can be scaled down.

(First Modified Example)

Figure 12:
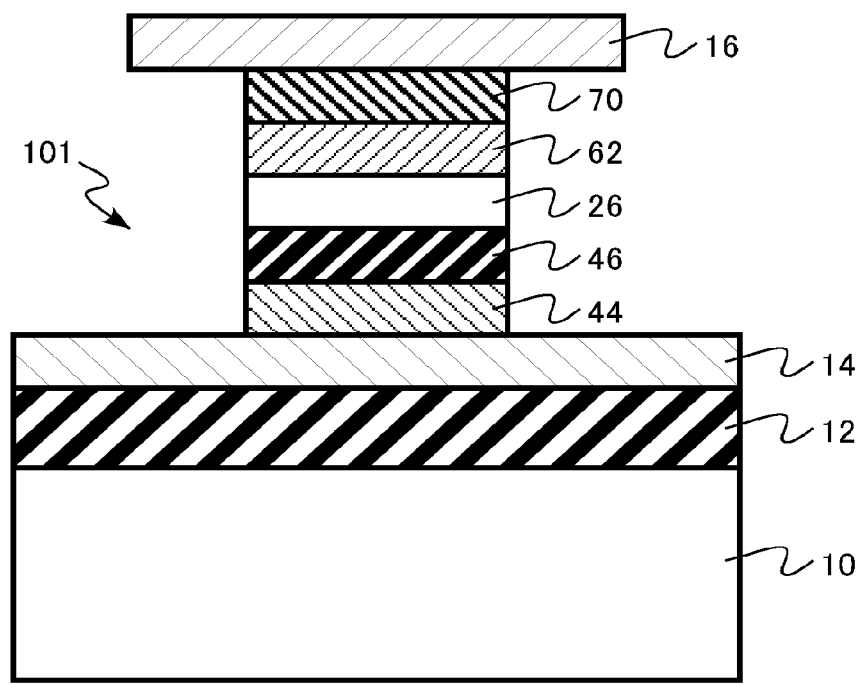
FIG. 12 is a schematic cross-sectional view illustrating a memory cell portion of a non-volatile memory device according to a first modified example of the fourth embodiment.

FIG. 12 is a schematic cross-sectional view illustrating a memory cell portion of a non-volatile memory device according to a first modified example of the fourth embodiment. The present modified example differs from the fourth embodiment in further including a third conductive layer of metal oxide provided on an opposite side of the ferroelectric film of the second conductive layer in a manner contacting the second conductive layer, in which a value obtained by multiplying the number of oxygen ions inside the layer by a valence 2 of oxygen is larger than a value obtained by multiplying the number of positive ions by a valence of the positive ion.

More specifically, as illustrated in FIG. 12, the memory cell 101 has a structure in which the metal layer (first conductive layer) 44, the insulating film 46 having the oxygen non-stoichiometric composition, the ferroelectric film 26 of hafnium oxide, the low oxygen concentration conductive layer (second conductive layer) 62, and a high oxygen concentration conductive layer (third conductive layer) 70 are stacked in a direction from the first electrode wiring 14 side to the second electrode wiring 16.

According to the present modified example, not only the insulating film 46 having the oxygen non-stoichiometric composition but also the high oxygen concentration conductive layer 70 function as the oxygen supply layers. Therefore, the structure of the present modified example is preferable in the case where the oxygen supply amount to the ferroelectric film 26 is needed to be further increased.

(Second Modified Example)

Figure 13:
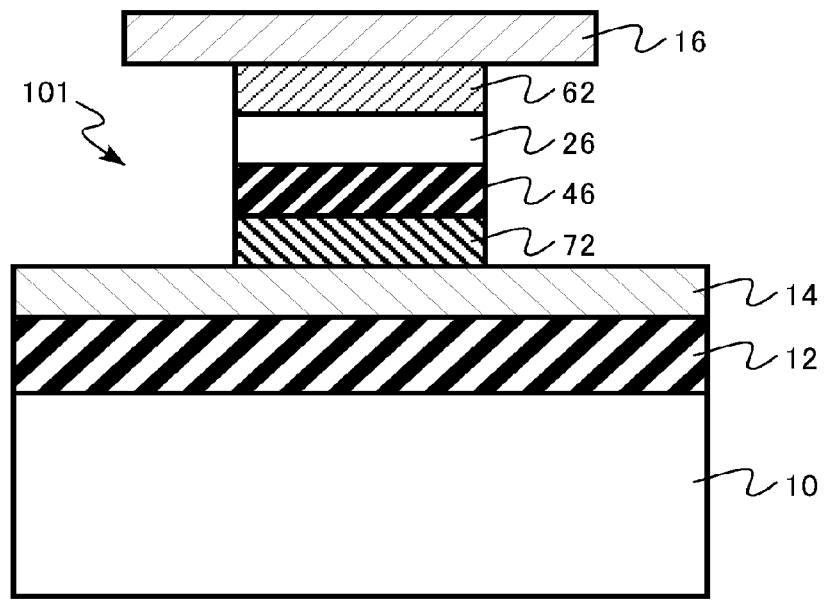
FIG. 13 is a schematic cross-sectional view illustrating a memory cell portion of a non-volatile memory device according to a second modified example of the fourth embodiment.

FIG. 13 is a schematic cross-sectional view illustrating a memory cell portion of a non-volatile memory device according to a second modified example of the fourth embodiment. The present modified example differs from the fourth embodiment in that a first conductive layer is metal oxide in which a value obtained by multiplying the number of oxygen ions inside the layer by a valence 2 of oxygen is larger than a value obtained by multiplying the number of positive ions by a valence of the positive ion.

More specifically, as illustrated in FIG. 13, the memory cell 101 has a structure in which a high oxygen concentration conductive layer (first conductive layer) 72, the insulating film 46 having the oxygen non-stoichiometric composition, the ferroelectric film 26 of hafnium oxide, and the low oxygen concentration conductive layer (second conductive layer) 62 are stacked in a direction from the first electrode wiring 14 side to the second electrode wiring 16. The high oxygen concentration conductive layer (first conductive layer) 72 is metal oxide in which the value obtained by multiplying the number of oxygen ions inside the layer by the valence 2 of oxygen is larger than the value obtained by multiplying the number of positive ions by the valence of the positive ion.

According to the present modified example, not only the insulating film 46 having the oxygen non-stoichiometric composition but also the high oxygen concentration conductive layer 72 function as the oxygen supply layers. Therefore, the structure of the present modified example is preferable in the case where the oxygen supply amount to the ferroelectric film 26 is needed to be further increased.

(Third Modified Example)

Figure 14:
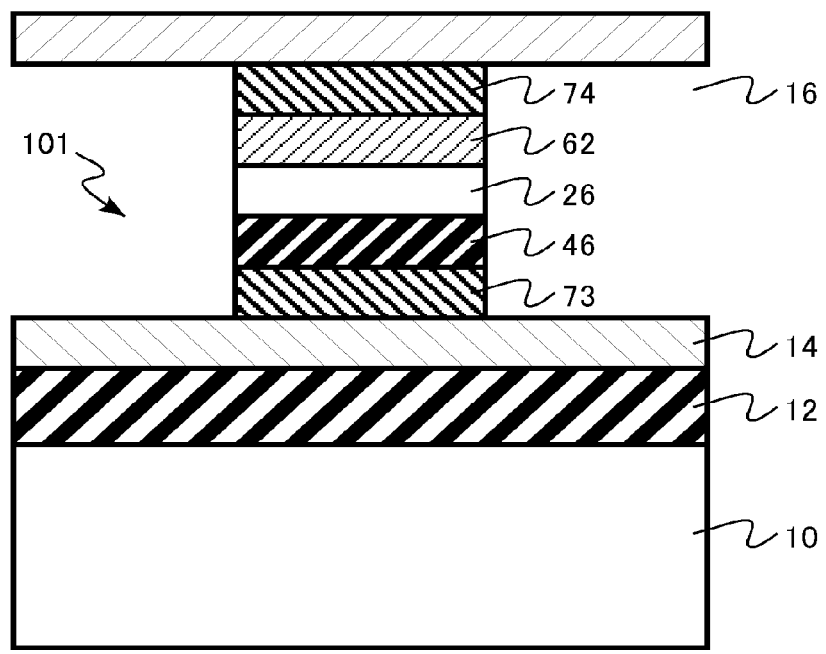
FIG. 14 is a schematic cross-sectional view illustrating a memory cell portion of a non-volatile memory device according to a third modified example of the fourth embodiment.

FIG. 14 is a schematic cross-sectional view illustrating a memory cell portion of a non-volatile memory device according to a third modified example of the fourth embodiment. The present modified example differs from the second modified example in further including a third conductive layer of metal oxide provided on an opposite side of the ferroelectric film of the second conductive layer in a manner contacting the second conductive layer, in which a value obtained by multiplying the number of oxygen ions inside the layer by a valence 2 of oxygen is larger than a value obtained by multiplying the number of positive ions by a valence of the positive ion.

More specifically, as illustrated in FIG. 14, the memory cell 101 has a structure in which a first high oxygen concentration conductive layer (first conductive layer) 73, the insulating film 46 having the oxygen non-stoichiometric composition, the ferroelectric film 26 of hafnium oxide, the low oxygen concentration conductive layer (second conductive layer) 62, and a second high oxygen concentration conductive layer (third conductive layer) 74 are stacked in a direction from the first electrode wiring 14 side to the second electrode wiring 16.

According to the present modified example, not only the insulating film 46 having the oxygen non-stoichiometric composition but also the first high oxygen concentration conductive layer 73 and the second high oxygen concentration conductive layer 74 function as the oxygen supply layers. Therefore, the structure of the present modified example is preferable in the case where the oxygen supply amount to the ferroelectric film 26 is needed to be further increased.

(Fourth Modified Example)

Figure 15:
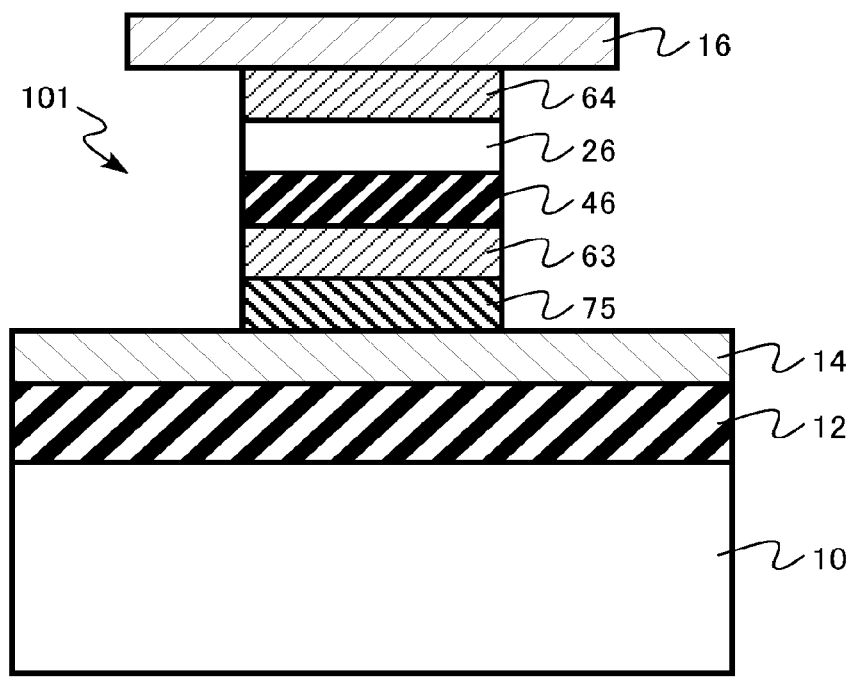
FIG. 15 is a schematic cross-sectional view illustrating a memory cell portion of a non-volatile memory device according to a fourth modified example of the fourth embodiment.

FIG. 15 is a schematic cross-sectional view illustrating a memory cell portion of a non-volatile memory device according to a fourth modified example of the fourth embodiment. The present modified example differs from the second modified example in further including a low oxygen concentration conductive layer between the high oxygen concentration conductive layer and the insulating film 46 having the oxygen non-stoichiometric composition.

More specifically, as illustrated in FIG. 15, the memory cell 101 has a structure in which a high oxygen concentration conductive layer (third conductive layer) 75, a first low oxygen concentration conductive layer (first conductive layer) 63, the insulating film 46 having the oxygen non-stoichiometric composition, the ferroelectric film 26 of hafnium oxide, and a second low oxygen concentration conductive layer (second conductive layer) 64 are stacked in a direction from the first electrode wiring 14 side to the second electrode wiring 16.

According to the present modified example, the first low oxygen concentration conductive layer (first conductive layer) 63 is provided between the high oxygen concentration conductive layer (third conductive layer) 75 and the insulating film 46 having the oxygen non-stoichiometric composition. Therefore, the structure is preferable in the case where the oxygen supply amount to the ferroelectric film 26 is needed to be suppressed to some extent.

(Fifth Modified Example)

Figure 16:
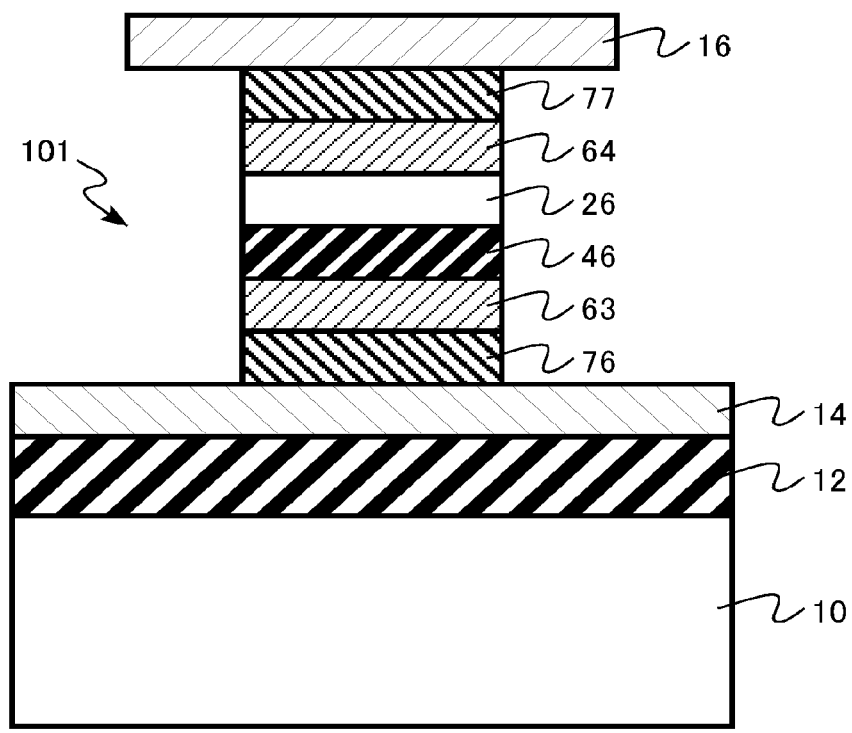
FIG. 16 is a schematic cross-sectional view illustrating a memory cell portion of a non-volatile memory device according to a fifth modified example of the fourth embodiment.

FIG. 16 is a schematic cross-sectional view illustrating a memory cell portion of a non-volatile memory device according to a fifth modified example of the fourth embodiment. The present modified example differs from the fourth modified example in further including a third conductive layer of metal oxide provided on an opposite side of the ferroelectric film of the second conductive layer in a manner contacting the second conductive layer, in which a value obtained by multiplying the number of oxygen ions inside the layer by a valence 2 of oxygen is larger than a value obtained by multiplying the number of positive ions by a valence of the positive ion.

More specifically, as illustrated in FIG. 16, the memory cell 101 has a structure in which a first high oxygen concentration conductive layer (third conductive layer) 76, the first low oxygen concentration conductive layer (first conductive layer) 63, the insulating film 46 having the oxygen non-stoichiometric composition, the ferroelectric film 26 of hafnium oxide, the second low oxygen concentration conductive layer (second conductive layer) 64, and a second high oxygen concentration conductive layer (third conductive layer) 77 are stacked in a direction from the first electrode wiring 14 side to the second electrode wiring 16.

According to the present modified example, not only the insulating film 46 having the oxygen non-stoichiometric composition but also the first high oxygen concentration conductive layer 76 and the second high oxygen concentration conductive layer 77 function as the oxygen supply layers. Therefore, the structure of the present modified example is preferable in the case where the oxygen supply amount to the ferroelectric film 26 is needed to be further increased.

As described above, the example in which the memory cell is only formed of one level has been described in the second, third, and fourth embodiments, but the three-dimensional structure including multiply-stacked levels can also be adopted in the second, third, and fourth embodiments as shown in the fourth modified example of the first embodiment.

While certain embodiments have been described, these embodiments have been presented by way of example only, and are not intended to limit the scope of the inventions. Indeed, a non-volatile memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A non-volatile memory device, comprising:
   a first conductive layer;

a second conductive layer including metal nitride, the metal nitride absorbing oxygen;

a paraelectric layer disposed between the first conductive layer and the second conductive layer;

a ferroelectric layer disposed between the paraelectric layer and the second conductive layer, the ferroelectric layer including hafnium oxide;

at least one third conductive layer disposed on opposite side of at least one of the first conductive layer and the second conductive layer to the ferroelectric layer, the at least one third conductive layer including metal oxide, the metal oxide having oxygen ratio larger than stoichiometric ratio; and a sense circuit configured to read data based on tunneling current flow between the first conductive layer and the second conductive layer through the paraelectric layer and the ferroelectric layer.

2. The device according to claim 1, wherein the metal nitride is titanium nitride.

3. The device according to claim 1, wherein the hafnium oxide includes a crystal structure of a space group $Pbc2_1$ (space group number 29).

4. The device according to claim 1, wherein the metal oxide is ruthenium oxide.

5. A non-volatile memory device, comprising:

a first conductive layer including metal oxide, the metal oxide having oxygen ratio larger than stoichiometric ratio;

a second conductive layer including metal nitride, the metal nitride absorbing oxygen;

a paraelectric layer disposed between the first conductive layer and the second conductive layer;

a ferroelectric layer disposed between the paraelectric layer and the second conductive layer, the ferroelectric layer including hafnium oxide; and a sense circuit configured to read data based on tunneling current flow between the first conductive layer and the second conductive layer through the paraelectric layer and the ferroelectric layer.

6. The device according to claim 5, wherein the metal nitride is titanium nitride.

7. The device according to claim 5, wherein the hafnium oxide includes a crystal structure of a space group $Pbc2_1$ (space group number 29).

8. The device according to claim 5, wherein the metal oxide is ruthenium oxide.

9. A non-volatile memory device, comprising:

a first conductive layer;

a second conductive layer including metal nitride, the metal nitride absorbing oxygen;

an insulating layer disposed between the first conductive layer and the second conductive layer, the insulating layer having oxygen non-stoichiometric composition;

a ferroelectric layer disposed between the insulating layer and the second conductive layer, the ferroelectric layer including hafnium oxide; and a sense circuit configured to read data based on tunneling current flow between the first conductive layer and the second conductive layer through the insulating layer and the ferroelectric layer.

10. The device according to claim 9, wherein the hafnium oxide includes a crystal structure of a space group $Pbc2_1$ (space group number 29).

* * * * *